(12) United States Patent
Chang et al.

(10) Patent No.: US 9,761,477 B2
(45) Date of Patent: *Sep. 12, 2017

(54) PRE-PACKAGE AND METHODS OF MANUFACTURING SEMICONDUCTOR PACKAGE AND ELECTRONIC DEVICE USING THE SAME

(71) Applicant: Samsung Electronics Co., Ltd., Suwon-si (KR)

(72) Inventors: Gun-ho Chang, Seoul (KR); Un-byoung Kang, Hwaseong-si (KR); Tae-je Cho, Yongin-si (KR)

(73) Assignee: SAMSUNG ELECTRONICS CO., LTD., Samsung-ro, Yeongton-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/286,801

(22) Filed: Oct. 6, 2016

(65) Prior Publication Data

US 2017/0025302 A1 Jan. 26, 2017

Related U.S. Application Data

(63) Continuation of application No. 14/838,389, filed on Aug. 28, 2015, now Pat. No. 9,478,514.

(30) Foreign Application Priority Data

Nov. 19, 2014 (KR) ........................ 10-2014-0161631

(51) Int. Cl.
*H01L 21/78* (2006.01)
*H01L 21/683* (2006.01)
(Continued)

(52) U.S. Cl.
CPC ........ *H01L 21/6836* (2013.01); *H01L 21/304* (2013.01); *H01L 21/6835* (2013.01); *H01L 21/76898* (2013.01); *H01L 21/78* (2013.01); *H01L 23/36* (2013.01); *H01L 23/544* (2013.01); *H01L 24/02* (2013.01); *H01L 24/05* (2013.01); *H01L 24/11* (2013.01); *H01L 24/13* (2013.01);
(Continued)

(58) Field of Classification Search
CPC ........................... H01L 21/6835; H01L 24/95
See application file for complete search history.

(56) References Cited

U.S. PATENT DOCUMENTS 7,226,812 B2 6/2007 Lu et al.
7,232,740 B1 6/2007 Mountain
(Continued)

FOREIGN PATENT DOCUMENTS

| JP | 2014-038877 | 2/2014 |
|---|---|---|
| JP | 2014-049537 | 3/2014 |
| KR | 10-1199487 | 11/2012 |

*Primary Examiner* — Daniel Shook
(74) *Attorney, Agent, or Firm* — Muir Patent Law, PLLC

(57) ABSTRACT

Methods of fabricating semiconductor packages are provided. One of the methods includes forming a protection layer including metal on a first surface of a substrate to cover a semiconductor device disposed on the first surface of the substrate, attaching a support substrate to the protection layer by using an adhesive member, processing a second surface of the substrate opposite to the protection layer to remove a part of the substrate, and detaching the support substrate from the substrate.

20 Claims, 38 Drawing Sheets

(51) Int. Cl.
*H01L 23/00* (2006.01)
*H01L 25/065* (2006.01)
*H01L 25/00* (2006.01)
*H01L 23/36* (2006.01)
*H01L 21/768* (2006.01)
*H01L 21/304* (2006.01)
*H01L 23/544* (2006.01)

(52) U.S. Cl.
CPC ............ *H01L 24/14* (2013.01); *H01L 24/95* (2013.01); *H01L 25/0657* (2013.01); *H01L 25/50* (2013.01); H01L 2221/6834 (2013.01); H01L 2221/68318 (2013.01); H01L 2221/68327 (2013.01); H01L 2221/68381 (2013.01); H01L 2221/68386 (2013.01); H01L 2223/5446 (2013.01); H01L 2224/0239 (2013.01); H01L 2224/02331 (2013.01); H01L 2224/02372 (2013.01); H01L 2224/02373 (2013.01); H01L 2224/0401 (2013.01); H01L 2224/05024 (2013.01); H01L 2224/11002 (2013.01); H01L 2224/11009 (2013.01); H01L 2224/1147 (2013.01); H01L 2224/11462 (2013.01); H01L 2224/11464 (2013.01); H01L 2224/11614 (2013.01); H01L 2224/11849 (2013.01); H01L 2224/13026 (2013.01); H01L 2224/1362 (2013.01); H01L 2224/13144 (2013.01); H01L 2224/13147 (2013.01); H01L 2224/13155 (2013.01); H01L 2224/13562 (2013.01); H01L 2224/13611 (2013.01); H01L 2224/13613 (2013.01); H01L 2224/13639 (2013.01); H01L 2224/13647 (2013.01); *H01L 2224/13664* (2013.01); *H01L 2224/14519* (2013.01); *H01L 2224/16145* (2013.01); *H01L 2224/16227* (2013.01); *H01L 2224/16245* (2013.01); *H01L 2224/17181* (2013.01); *H01L 2224/73253* (2013.01); *H01L 2225/06513* (2013.01); *H01L 2225/06517* (2013.01); *H01L 2225/06541* (2013.01); *H01L 2225/06544* (2013.01); *H01L 2225/06555* (2013.01); *H01L 2225/06582* (2013.01); *H01L 2225/06589* (2013.01); *H01L 2924/014* (2013.01); *H01L 2924/01013* (2013.01); *H01L 2924/01022* (2013.01); *H01L 2924/01029* (2013.01); *H01L 2924/01073* (2013.01); *H01L 2924/01074* (2013.01); *H01L 2924/04941* (2013.01); *H01L 2924/04953* (2013.01); *H01L 2924/15311* (2013.01); *H01L 2924/15313* (2013.01); *H01L 2924/18161* (2013.01)

(56) References Cited

U.S. PATENT DOCUMENTS

| | | | |
|---|---|---|---|
| 7,541,203 | B1 | 6/2009 | Knickerbocker |
| 7,842,548 | B2 | 11/2010 | Lee et al. |
| 7,960,840 | B2 | 6/2011 | Bonifield et al. |
| 8,313,982 | B2 | 11/2012 | Dunne et al. |
| 8,329,554 | B2 | 12/2012 | Shin et al. |
| 8,507,361 | B2 | 8/2013 | Letertre et al. |
| 8,575,005 | B2 | 11/2013 | Accardi et al. |
| 9,478,514 | B2 * | 10/2016 | Chang ................. H01L 21/6836 |
| 2014/0183728 | A1 * | 7/2014 | Han ........................ H01L 24/14 257/737 |

* cited by examiner

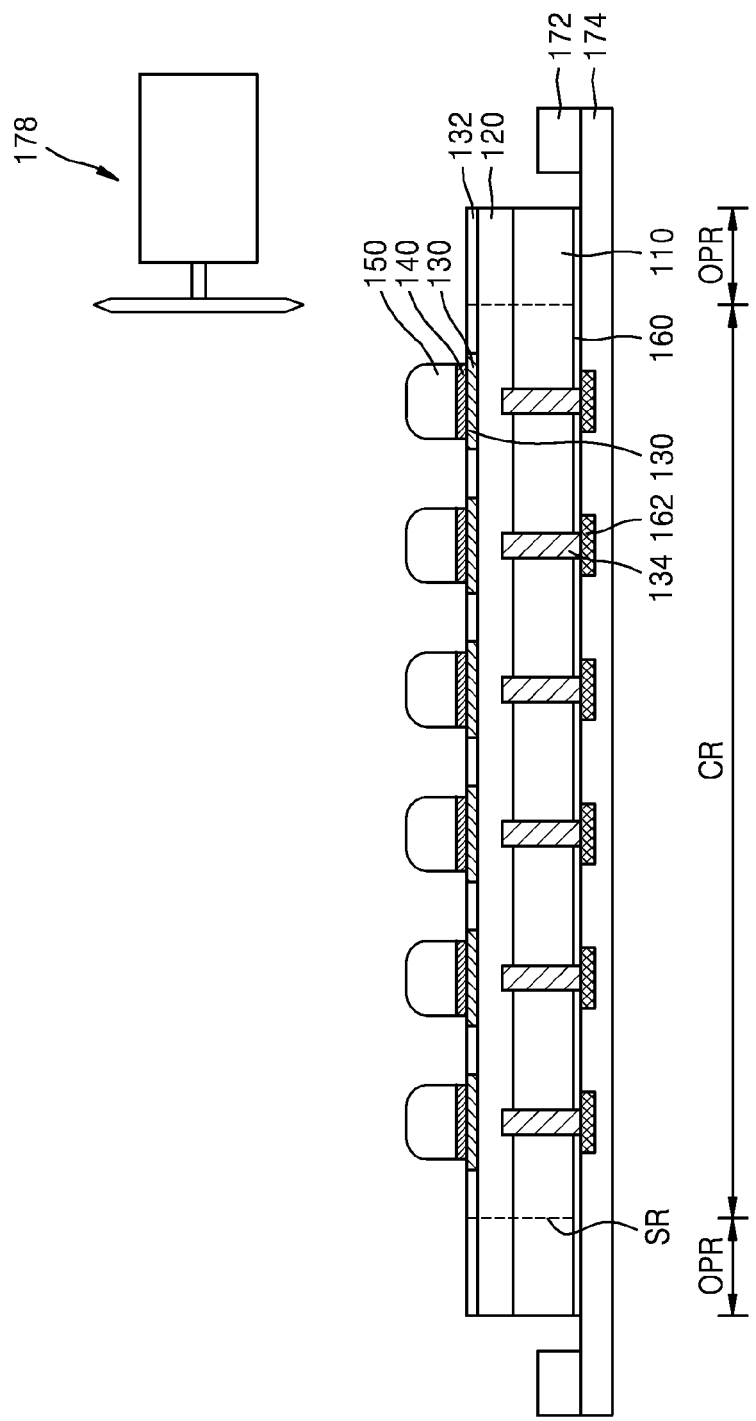

PRE-PACKAGE AND METHODS OF MANUFACTURING SEMICONDUCTOR PACKAGE AND ELECTRONIC DEVICE USING THE SAME

CROSS-REFERENCE TO RELATED APPLICATION

This application is a Continuation application of U.S. patent application Ser. No. 14/838,389, filed Aug. 28, 2015, which claims the benefit of priority to Korean Patent Application No. 10-2014-0161631, filed on Nov. 19, 2014, in the Korean Intellectual Property Office, the disclosure of each of which is incorporated herein in its entirety by reference.

BACKGROUND

Aspects of the inventive concept relate to pre-packages and methods of manufacturing semiconductor packages using the same, and more particularly, to pre-packages including bumps and methods of manufacturing semiconductor packages using the same.

In the electronics industry, compact and light semiconductor packages are increasingly in demand with the development of smaller and lighter electronic systems. In response to such a demand, the thickness of semiconductor chips has been continuously reduced and stack packages have been developed using the thin semiconductor chips. However, while the thin semiconductor chips are formed or the thin semiconductor chips are stacked to fabricate compact and light semiconductor packages such as stack packages, semiconductor chips may be damaged, thus causing the semiconductor packages to malfunction or causing characteristics of the semiconductor packages to degrade.

SUMMARY

According to an aspect of the inventive concept, there is provided a method of manufacturing a semiconductor package. The method comprises forming a protection layer including metal continuously formed on a first surface of a substrate to cover a plurality of semiconductor devices that are disposed on the first surface of the substrate, attaching a support substrate to a top surface of the protection layer by using an adhesive member, processing a second surface of the substrate opposite to the protection layer to remove a portion of the substrate, and detaching the support substrate from the substrate. The protection layer may remain to continuously cover the plurality of semiconductor devices after the support substrate is detached from the substrate.

According to another aspect of the inventive concept, there is provided a method of manufacturing a semiconductor package. The method comprises forming a semiconductor device on a first surface of a substrate, forming bump pads electrically connected to the semiconductor device on the first surface of the substrate, forming a seed metal layer on the bump pads, forming bumps on the seed metal layer to overlap with the bump pads, forming a light-to-heat conversion layer over the first surface of the substrate to cover the bumps and the seed metal layer, attaching a support substrate to the substrate so that an adhesive member is disposed between the light-to-heat conversion layer and the support substrate, processing a second surface of the substrate opposite to the semiconductor device and the bump pads to remove a portion of the substrate, irradiating laser beams onto the support substrate to detach the light-to-heat conversion layer, the adhesive member, and the support substrate from the seed metal layer, and removing portions of the seed metal layer not covered by the bumps.

According to yet another aspect of the inventive concept, there is provided a method of manufacturing a semiconductor package. The method comprises forming a semiconductor device on a first surface of a substrate, forming bump pads electrically connected to the semiconductor device on the first surface of the substrate, forming a seed metal layer on the bump pads, forming bumps on the seed metal layer to overlap with the bump pads, forming an adhesive member over the first surface of the substrate to cover at least a portion of the seed metal layer, attaching a support substrate to the substrate so that the adhesive member is disposed between the seed meal layer and the support substrate, processing a second surface of the substrate opposite to the semiconductor device and the bump pads to remove a portion of the substrate, detaching the adhesive member and the support substrate from the seed metal layer, and removing portions of the seed metal layer not covered by the bumps.

According to still another aspect of the inventive concept, there is provided a pre-package. The pre-package comprises a substrate having a plurality of semiconductor chip regions which are defined and distinguished from each other by a scribe region, at least one semiconductor device formed in each of the semiconductor chip regions, a protection layer formed of metal and disposed on a first surface of the substrate opposite to the semiconductor devices, and bumps disposed on the protection layer and electrically connected to the semiconductor devices.

According to some embodiments, a method of manufacturing an electronic device includes steps of providing a plurality of semiconductor devices on a first surface of a substrate, providing a plurality of pads on the first surface of the substrate, which pads are electrically coupled to the plurality of semiconductor devices, providing a protection layer including metal on the first surface of the substrate to continuously cover two or more of the pads, attaching a support substrate to the top surface of the protection layer by using an adhesive member, processing a second surface of the substrate opposite the protection layer to remove a portion of the substrate, and detaching the support substrate from the substrate, wherein the protection layer remains to continuously cover the two or more pads when the support substrate is detached from the substrate.

The method may further include a step of forming bumps on the protection layer before the support substrate is attached to the protection layer, wherein the bumps may be electrically connected to the semiconductor device through the pads. The method may further include a step removing portions of the protection layer that are not covered by the bumps after the support substrate is detached from the substrate. The attaching of the support substrate to the top surface of the protection layer include steps of sequentially forming a light-to-heat conversion layer and the adhesive member on the protection layer, and attaching the support substrate to the adhesive member. The adhesive member may be formed between the protection layer and the support substrate, and the adhesive member may be formed to directly contact at least a portion of the protection layer and at least a portion of the support substrate. The detaching of the support substrate from the substrate may include supplying a debonding solvent to a portion of the adhesive member to dissolve the portion of the adhesive member.

The method may further include steps of forming a seed metal layer on the first surface of the substrate, forming bumps on the seed metal layer, the bumps being electrically connected to the semiconductor device through the seed metal layer, and removing portions of the seed metal layer which are not covered by the bumps. The protection layer may be formed on the first surface of the substrate to cover the bumps. The method may further include steps of providing a bus electrically coupled to the semiconductor device, and providing a micro processing unit electrically coupled to the bus. The method may further include a step of providing a display device electrically coupled to the bus.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Figure 1A:
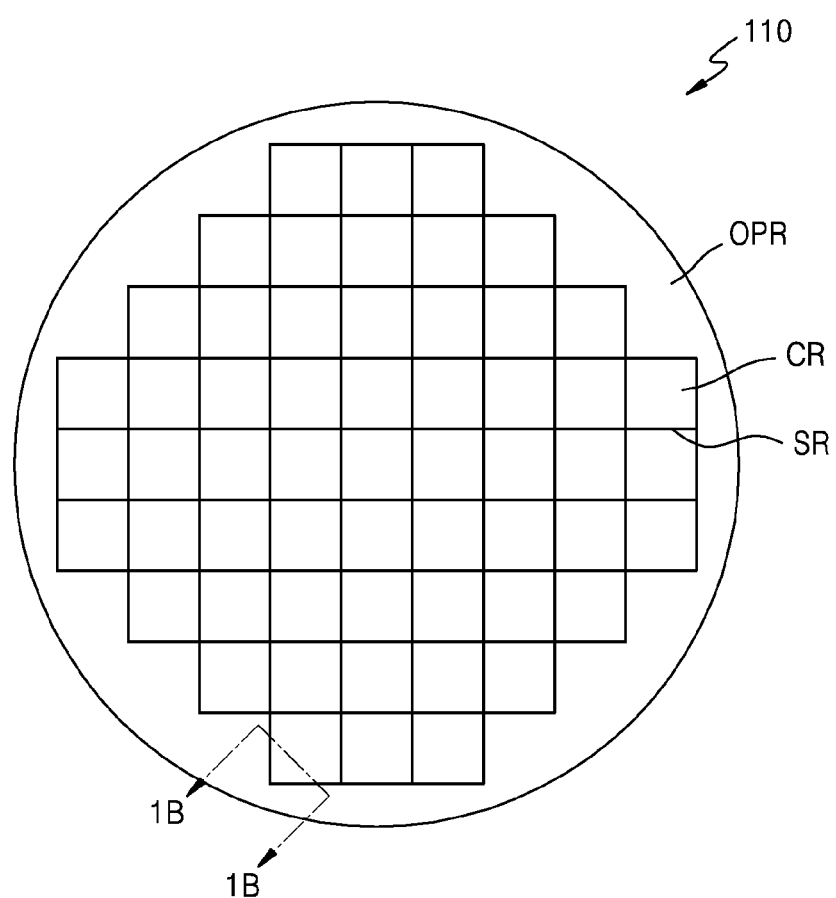
FIG. 1A is a plan view of a substrate for illustrating a method of manufacturing a semiconductor package according to an embodiment of the inventive concept.

Various exemplary embodiments of the inventive concept will now be described more fully hereinafter with reference to the accompanying drawings to better understand configurations and effects of the inventive concept. It should be noted, however, that the inventive concept is not limited to the following exemplary embodiments, and may be implemented in various forms. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the sizes and relative sizes of layers and regions may be exaggerated for clarity. Like numerals refer to like elements throughout.

It will be understood that when an element such as a layer, region or substrate is referred to as being "on" another element, it can be directly on the other element or intervening elements may be present. In contrast, the term "directly" means that there are no intervening elements. Other words used to describe the relationship between elements or layers should be interpreted in a like fashion (e.g., "between" versus "directly between," "adjacent" versus "directly adjacent," "on" versus "directly on"). However, the term "contact," as used herein refers to direct contact (i.e., touching) unless the context indicates otherwise.

It will also be understood that, although the terms "first", "second", etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed in one part of the specification could be termed a second element, component, region, layer or section in another part of the specification without departing from the teachings of example embodiments. In addition, in certain cases, even if a term is not described using "first," "second," etc., in the specification, it may still be referred to as "first" or "second" in a claim in order to distinguish different claimed elements from each other.

As used herein, the singular terms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong.

As used herein, the term "and/or" includes any and all combinations of one or more of the associated listed items. In addition, expressions such as "at least one of," when preceding a list of elements, modify the entire list of elements and do not modify the individual elements of the list.

As used herein, a semiconductor device may refer to various devices, for example, a device such as a one or more transistors, a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

As used herein, a layer or a pattern described as including or being formed of a material may refer to a layer or a pattern including or formed of only the material of a single element (e.g., element from the periodic table), a compound including the element, an alloy including the element, or a mixture of the element with other materials, or combination or two or more of these. For example, if a layer includes or is formed of silver, the layer may include silver in its element form, a silver compound, a silver alloy, or a mixture of silver with other materials in the layer.

Figure 1B:
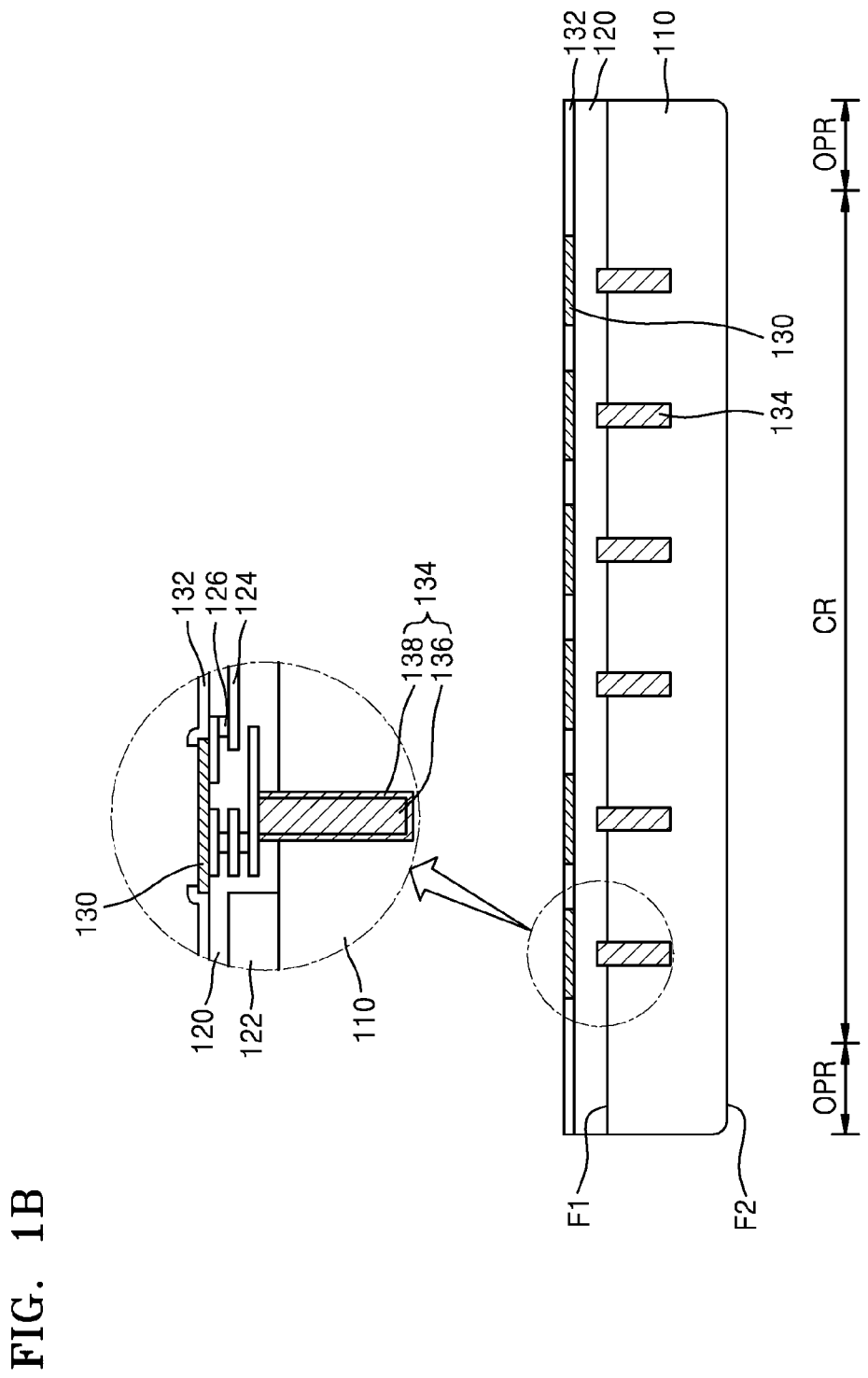
FIGS. 1B to 1R are cross-sectional views taken along a line 1B-1B of FIG. 1A.
Figure 1C:
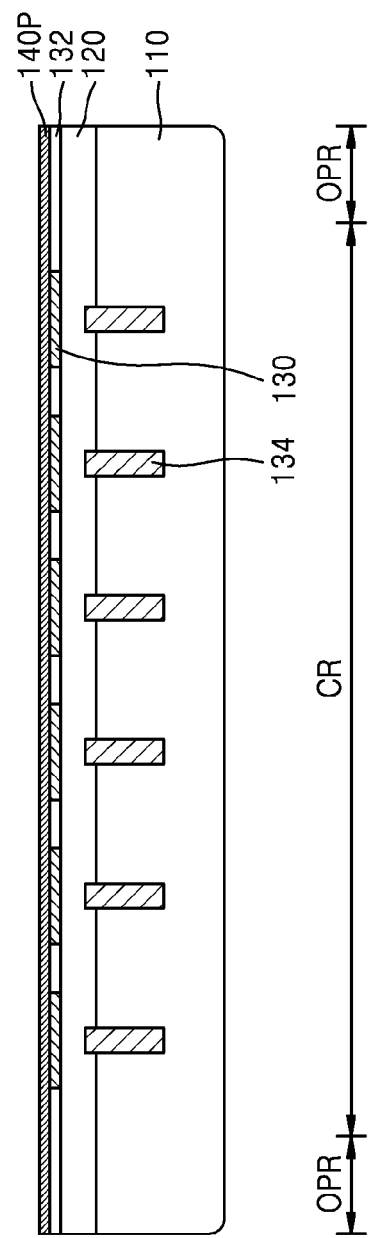
Figure 1D:
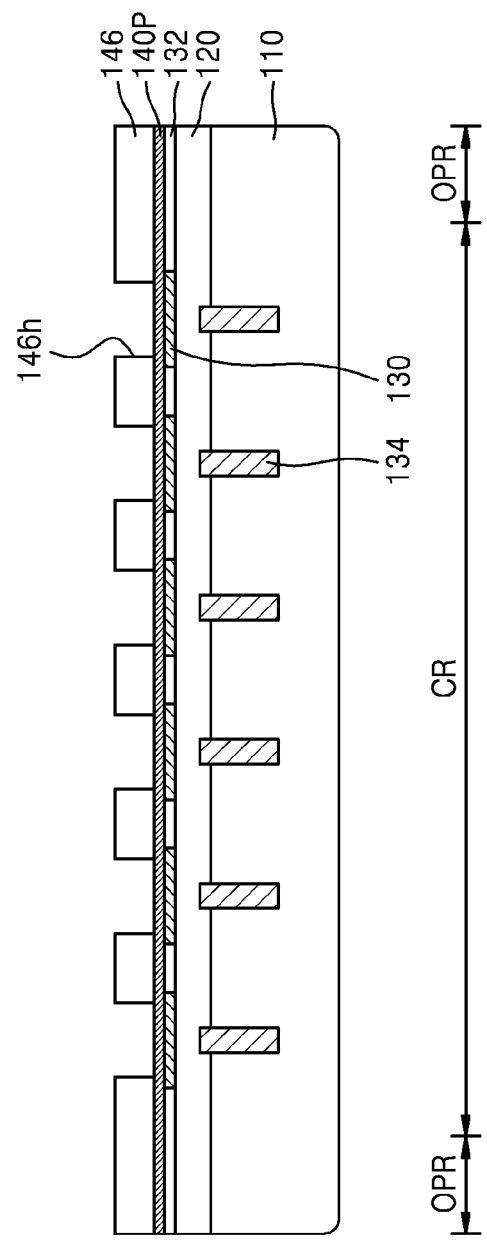
Figure 1E:
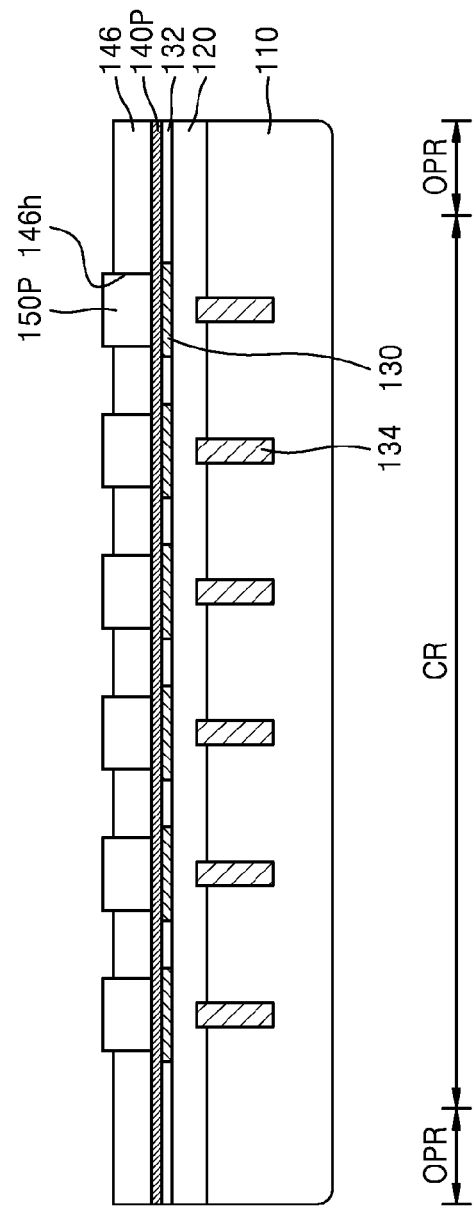
Figure 1F:
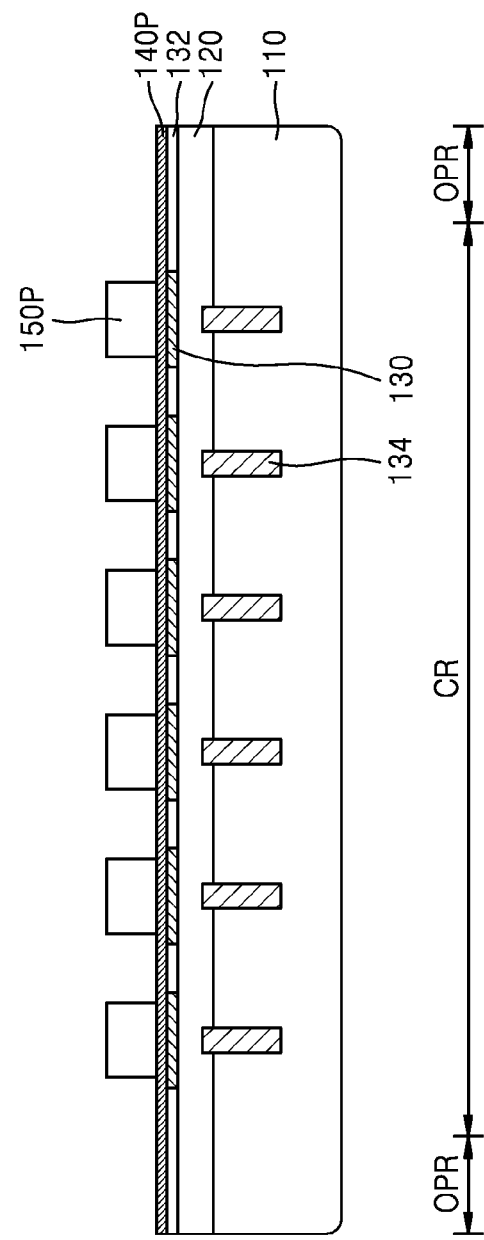
Figure 1G:
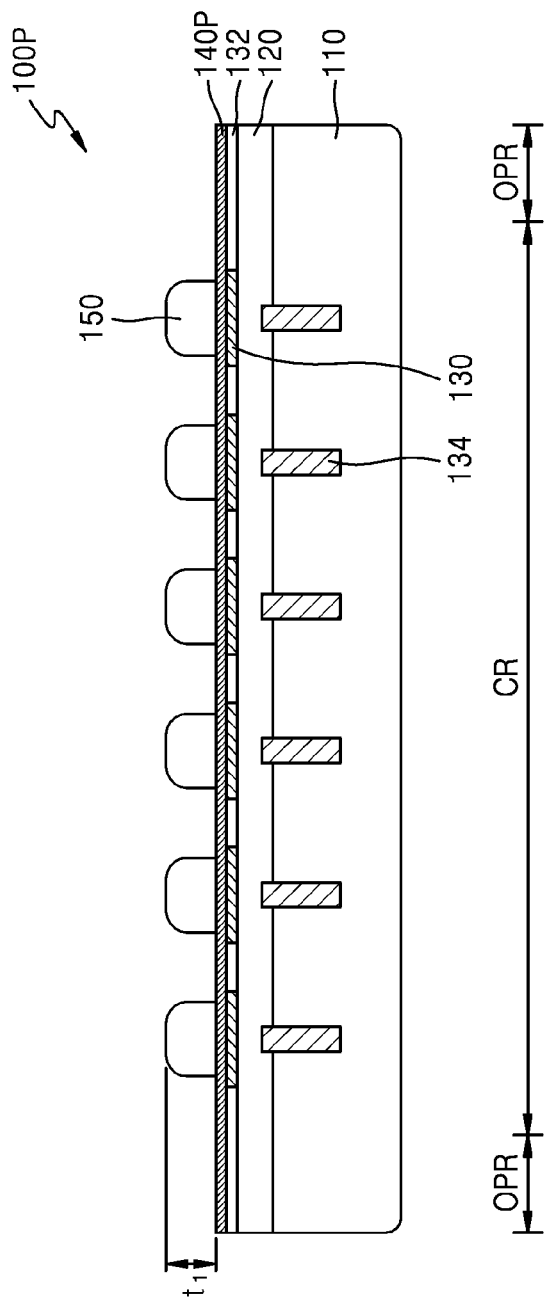
Figure 1H:
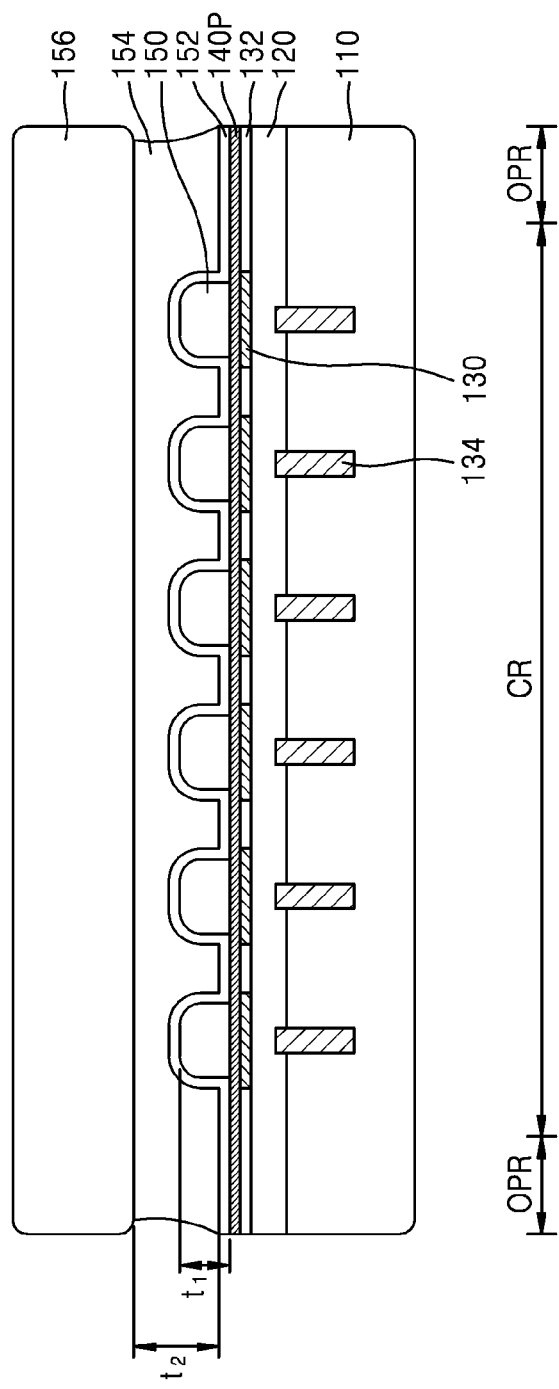
Figure 1I:
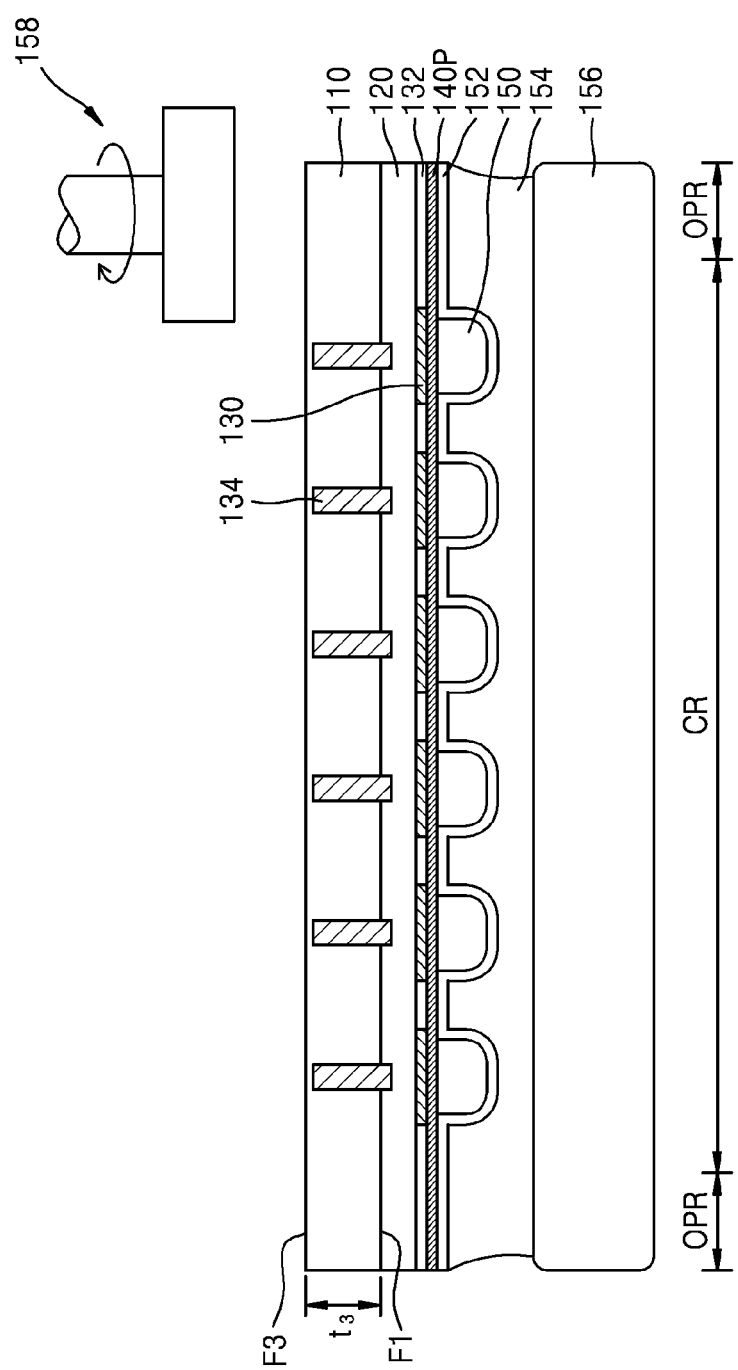
Figure 1J:
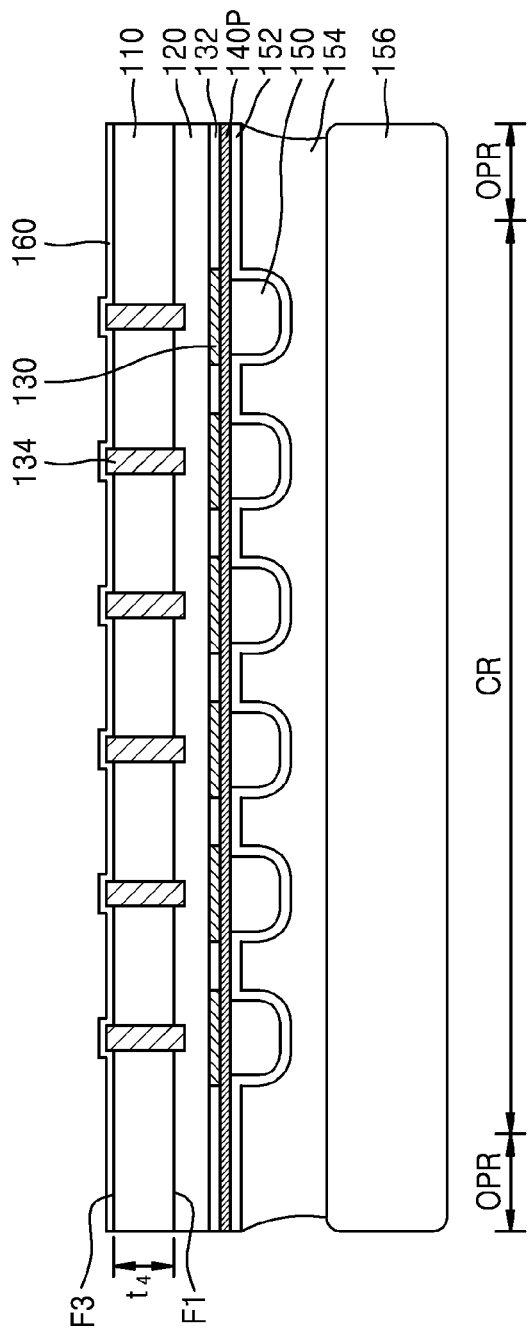
Figure 1K:
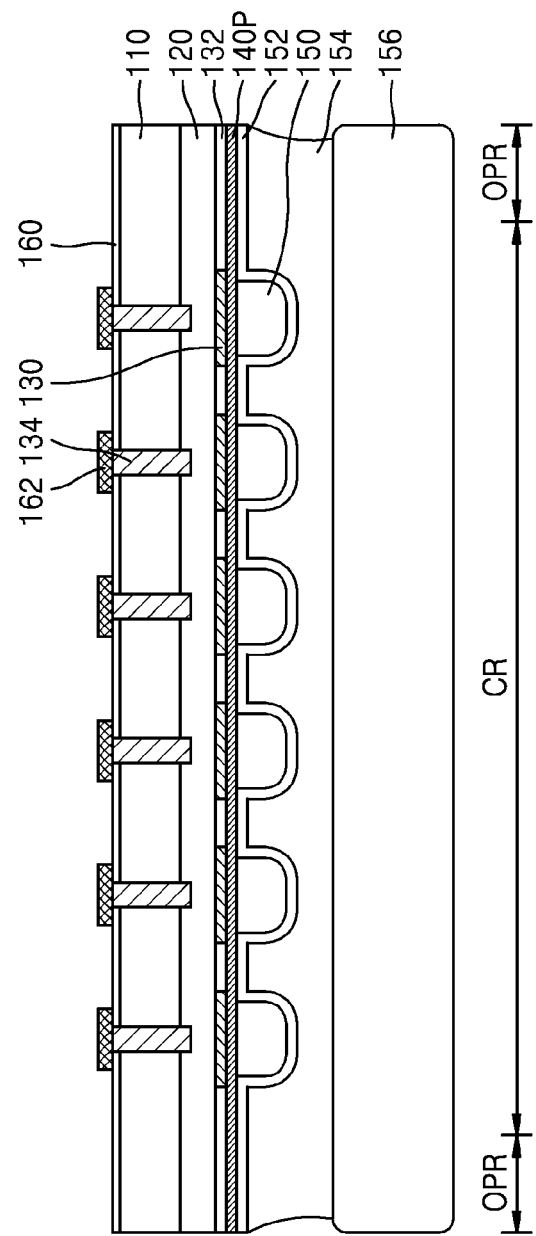
Figure 1L:
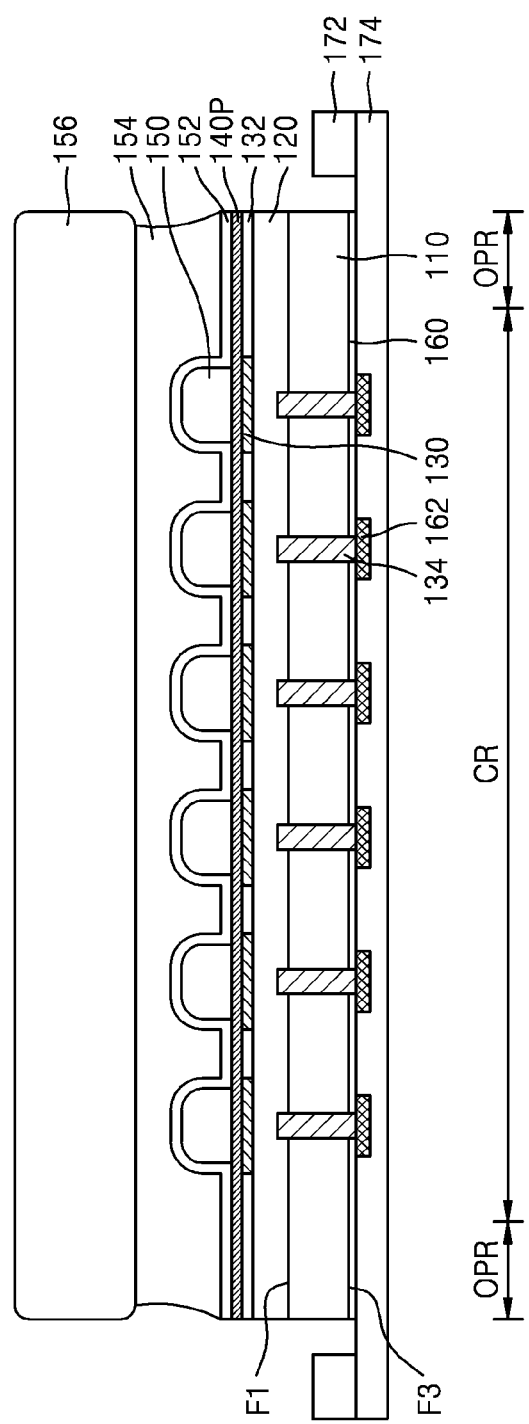
Figure 1M:
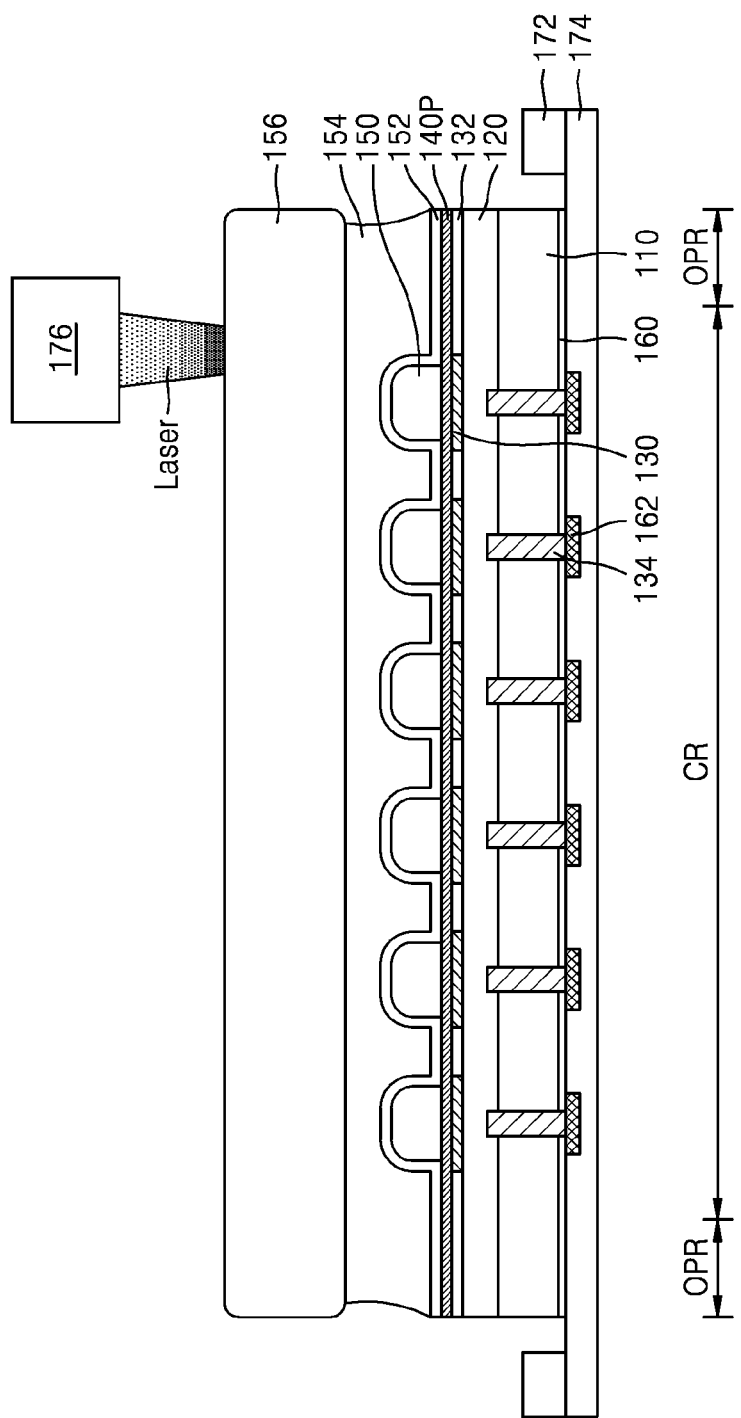
Figure 1N:
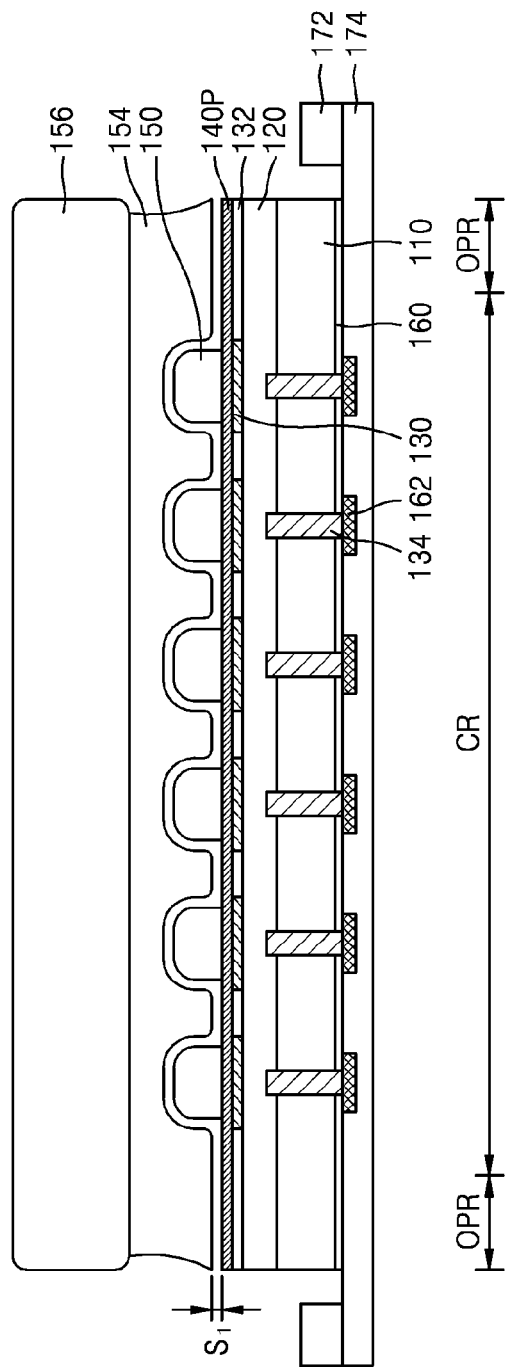
Figure 1P:
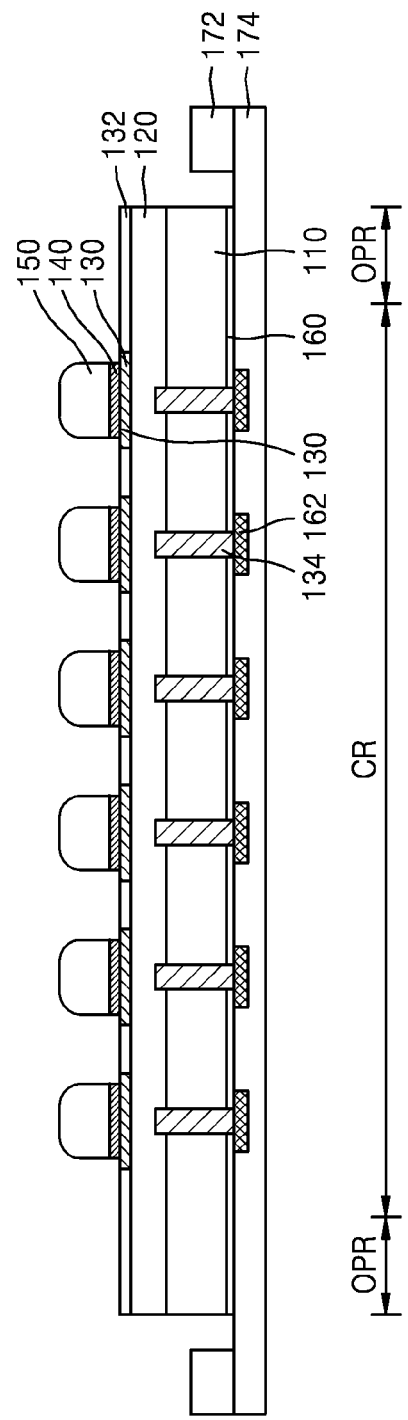
Figure 1R:
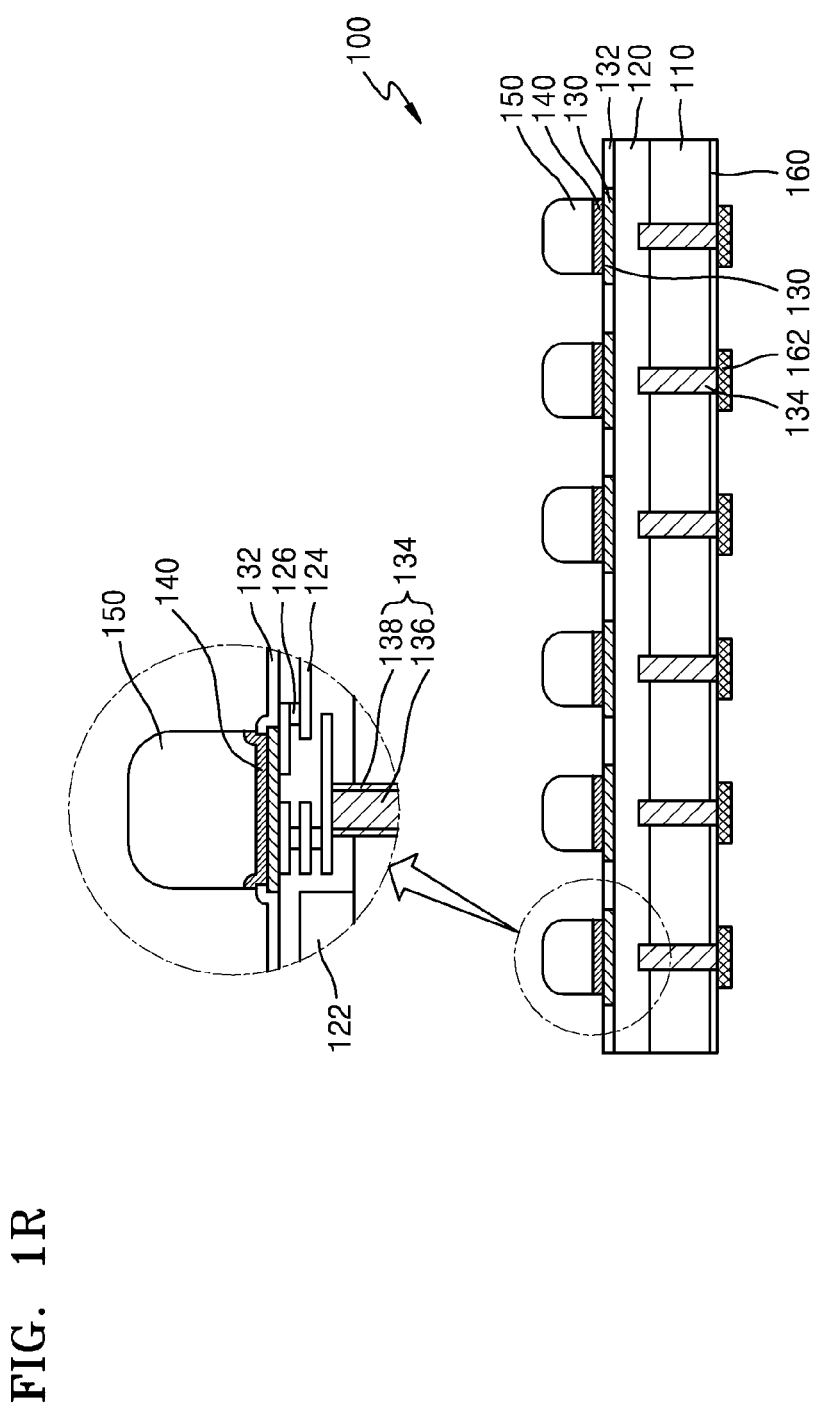

FIG. 1A is a plan view of a substrate for illustrating a method of manufacturing a semiconductor package according to an embodiment of the inventive concept, and FIGS. 1B to 1R illustrate cross-sectional views taken along a line 1B-1B of FIG. 1A according to a process sequence.

Referring to FIG. 1A, semiconductor chip regions CR may be provided on a first substrate 110, for example, a wafer. Each of the semiconductor chip regions CR may be formed to include a semiconductor device and an interconnection structure. The semiconductor chip regions CR may be separated from each other in a subsequent process to provide a plurality of semiconductor packages. The semiconductor chip regions CR may be defined and distinguished from each other by a scribe region SR such as a scribe lane therebetween. Although the scribe region SR is illustrated as a line in FIG. 1A, the scribe region SR may be disposed between the semiconductor chip regions CR to actually have a predetermined width. In addition, no semiconductor chip region CR is provided in an edge of the first substrate 110 that corresponds to an outer periphery region OPR.

Referring to FIG. 1B, the first substrate 110 may include a first surface F1 and a second surface F2, which are opposite to each other, and semiconductor devices 122 may be formed on the first surface F1 of the first substrate 110. The first surface F1 of the first substrate 110 may be an active surface on which the semiconductor devices 122 are formed, and the second surface F2 of the first substrate 110 may be an inactive surface, which is opposite to the active surface.

The first substrate 110 may include a semiconductor material such as silicon (Si) or germanium (Ge). Alternatively, the first substrate 110 may include a compound semiconductor material such as silicon carbide (SiC), gallium arsenide (GaAs), indium arsenide (InAs), or indium phosphide (InP). In some embodiments, the first substrate 110 may be a silicon on insulator (SOI) substrate. For example, the first substrate 110 may include a buried oxide layer. In other embodiments, the first substrate 110 may include a conductive region, for example, a well region doped with impurities or a conductive structure doped with impurities.

A first insulating interlayer 120 may be formed on the first surface F1 of the first substrate 110. The first insulating interlayer 120 may be formed to include, for example, silicon oxide, silicon oxynitride, silicon nitride, or a combination thereof. The semiconductor devices 122 may be formed on the first surface F1 of the first substrate 110, and the first insulating interlayer 120 may be formed to cover the semiconductor devices 122. For example, the first insulating interlayer 120 may be formed to cover conductive interconnection lines (not shown) or conductive plugs (not shown) which are electrically connected to the semiconductor devices 122 and the conductive regions of the first substrate 110.

Each of the semiconductor devices 122 may be formed to include at least one of various devices. For example, each semiconductor device 122 may be formed to include complementary metal-oxide-semiconductor (CMOS) circuits, which are comprised of N-channel MOS field effect transistors (FETs) and P-channel MOS field effect transistors (FETs). Each semiconductor device 122 may include passive elements such as capacitors, resistors, and/or inductors. In some embodiments, each of the semiconductor devices 122 may be a system large scale integration (LSI) device, an image sensor such as a CMOS image sensor (CIS), or a micro-electro-mechanical system (MEMS).

An interconnection structure (not shown) may be formed in the first insulating interlayer 120 and may be electrically connected to the semiconductor devices 122. The interconnection structure may include interconnection lines 124 and conductive vias 126. Each of the interconnection lines 124 may be formed to include an interconnection barrier layer and an interconnection metal layer. Similarly, each of the conductive vias 126 may be formed to include an interconnection barrier layer and an interconnection metal layer. The interconnection barrier layer may include at least one selected from the group consisting of titanium (Ti), titanium nitride (TiN), tantalum (Ta), and tantalum nitride (TaN). The interconnection metal layer may include at least one selected from the group including tungsten (W), aluminum (Al), and copper (Cu). In certain embodiments, the interconnection lines 124 and the conductive vias 126 may be formed of the same material as the interconnection metal layer. Alternatively, the interconnection lines 124 may be formed of a material different from the material of the conductive vias 126. The interconnection lines 124 and the conductive vias 126 may be formed to have a multi-layered structure. For example, as illustrated in FIG. 1B, the interconnection lines 124 may be disposed at two or more different levels and the conductive vias 126 may be disposed between the interconnection lines 124 disposed at different levels.

First front side pads 130 may be formed on a top surface of the first insulating interlayer 120. The first front side pads 130 may be electrically connected to the interconnection structure and may also be electrically connected to the semiconductor devices 122 through the interconnection structure. In some embodiments, the first front side pads 130 may be formed of at least one selected from the group consisting of tungsten (W), aluminum (Al), copper (Cu), and an alloy thereof.

A first passivation layer 132 may be formed on the first insulating interlayer 120 to protect the semiconductor devices 122 from external shock or moisture. The first passivation layer 132 may be formed to have pad openings that expose the first front side pads 130. Edges of the first front side pads 130 may be covered by the first passivation layer 132. In some embodiments, the first passivation layer 132 may be formed of an insulation material, for example, a material including silicon nitride or polyimide.

Through-substrate vias 134 may be formed to extend from the first surface F1 of the first substrate 110 into a bulk region of the first substrate 110. The through-substrate vias 134 may be formed to have a pillar shape. Each of the through-substrate vias 134 may be formed to include a buried conductive layer 136 and a barrier layer 138 surrounding the buried conductive layer 136. The buried conductive layer 136 may be formed to include at least one selected from the group consisting of an alloy containing copper, tungsten (W), an alloy containing tungsten (W), nickel (Ni), ruthenium (Ru), and cobalt (Co). The alloy containing copper may include copper (Cu), copper tin (CuSn), copper magnesium (CuMg), copper nickel (CuNi), copper zinc (CuZn), copper palladium (CuPd), copper gold (CuAu), copper rhenium (CuRe), and copper tungsten (CuW). The barrier layer 138 may be formed to include at least one selected from the group consisting of titanium (Ti), titanium nitride (TiN), tantalum (Ta), tantalum nitride (TaN), ruthenium (Ru), cobalt (Co), manganese (Mn), tungsten nitride (WN), nickel (Ni), and nickel boron (NiB). A first insulation layer (not shown) may be formed between the first substrate 110 and the through-substrate vias 134 to electrically insulate the through-substrate vias 134 from the first substrate 110. The first insulation layer may be formed to include one or more of an oxide layer, a nitride layer, a carbide layer and a combination thereof. For example, the first insulation layer may include multiple materials of an oxide, a nitride and/or a carbide. The first insulation layer may be multiple layers of afore-mentioned material layers. The first insulation layer may be formed to have a thickness of about 1500 angstroms to about 2500 angstroms.

The through-substrate vias 134 may extend from the first surface F1 of the first substrate 110 into a bulk region of the first substrate 110, as described above. Some of the interconnection lines 124 and the conductive vias 126 may be formed to extend into the first substrate 110. In certain embodiments, the through-substrate vias 134 may include all of pillar-shaped conductive materials that extend into the first substrate 110. The through-substrate vias 134 may be electrically connected to or insulated from the semiconductor devices 122. For example, if the number of the through-substrate vias 134 is two or more, at least one of the through-substrate vias 134 may be electrically insulated from the semiconductor devices 122 and the others of the through-substrate vias 134 may be electrically connected to the semiconductor devices 122. In some other embodiments, all of the through-substrate vias 134 may be electrically insulated from or connected to the semiconductor devices 122.

The through-substrate vias 134 may be electrically connected to the first front side pads 130. In some embodiments, some of the through-substrate vias 134 may be electrically insulated from the first front side pads 130, and the others of the through-substrate vias 134 may be electrically connected to the first front side pads 130. Some of the first front side pads 130 may not be electrically connected to the through-substrate vias 134 and may be electrically connected to the interconnection structure which is electrically connected to the semiconductor devices 122.

Referring to FIG. 1C, a seed metal layer 140P may be formed on the first passivation layer 132 and the first front side pads 130.

The seed metal layer 140P may be formed by sequentially stacking a barrier layer (not shown) and a seed layer (not shown). The barrier layer of the seed metal layer 140P may be formed to prevent metal atoms in the seed layer from being diffused into the first substrate 110 which is located under the seed metal layer 140P. For example, the barrier layer of the seed metal layer 140P may act as a wetting layer for increasing the adhesive strength between the seed layer of the seed metal layer 140P and the first passivation layer 132 as well as between the seed layer of the seed metal layer 140P and the first front side pads 130. In some embodiments, the barrier layer of the seed metal layer 140P may be formed of chromium, nickel, titanium, titanium tungsten, or a combination thereof. The barrier layer of the seed metal layer 140P may be formed using a physical vapor deposition (PVD) process such as a sputtering process, or a chemical vapor deposition (CVD) process. The seed layer of the seed metal layer 140P may be formed of copper, nickel, gold, silver, or a combination thereof.

Referring to FIG. 1D, a bump mask 146 may be formed on the seed metal layer 140P. In some embodiments, the bump mask 146 may be a photoresist pattern. The bump mask 146 may be formed to have openings 146h that expose portions of the seed metal layer 140P. The openings 146h may be formed to vertically overlap with the first front side pads 130, respectively. As illustrated in FIG. 1D, a width of the openings 146h in a horizontal direction (a direction parallel with the first surface F1 of the first substrate 110) may be smaller than a width of the first front side pads 130 in the horizontal direction. However, the inventive concept is not limited to the above condition. For example, in some embodiments, the width of the openings 146h in the horizontal direction may be equal to or greater than the width of the first front side pads 130 in the horizontal direction. In some embodiments, each of the openings 146h may be formed to have a circular shape, an oval shape or a rectangular shape when viewed from a plan view, but the inventive concept is not limited thereto.

Although FIG. 1D illustrates an example in which the openings 146h are formed to respectively correspond to the first front side pads 130, the inventive concept is not limited thereto. For example, in some embodiments, the openings 146h may be formed so that the number of the openings 146h is greater than the number of the first front side pads 130. For example, the openings 146h may be formed to include dummy openings that do not overlap with any of the first front side pads 130. In such a case, dummy bumps (not shown) may be formed in the dummy openings in a subsequent process. The dummy bumps may not be electrically connected to the semiconductor devices 122 or the through-substrate vias 134. The dummy bumps may be formed to have the same height as solder bumps (150 of FIG. 1G) which are formed in a subsequent process. Accordingly, if the dummy bumps are formed, stress may be dispersed to the dummy bumps and the solder bumps, otherwise the stress would be concentrated on the solder bumps.

Referring to FIG. 1E, preliminary solder bumps 150P may be formed in the openings 146h. Each of the preliminary solder bumps 150P may be formed to include a pillar (not shown) and a solder pattern (not shown) on the pillar. The pillar may be formed of copper (Cu), nickel (Ni), gold (Au), or an alloy thereof. The pillar may be formed using an electroplating process or an electroless plating process. The solder pattern may be formed of tin (Sn) or an alloy of tin (Sn) (e.g., an alloy of tin (Sn) and silver (Ag)). In some embodiments, the solder pattern may further include copper (Cu), palladium (Pd), bismuth (Bi) or antimony (Sb) as an additive agent. The solder pattern may be formed using an electroplating process or an electroless plating process.

Although FIG. 1E illustrates an example in which the preliminary solder bumps 150P are formed to protrude from a top surface of the bump mask 146, the inventive concept is not limited thereto. For example, in some embodiments, the preliminary solder bumps 150P may be formed so that top surfaces of the preliminary solder bumps 150P are located at a level equal to or lower than the top surface of the bump mask 146.

Referring to FIG. 1F, the bump mask (146 of FIG. 1E) may be removed. The bump mask 146 may be removed using a strip process or an ashing process.

In some embodiments, a process for removing a native oxide layer (not shown) on the surfaces of the preliminary solder bumps 150P may be additionally performed after the bump mask 146 is removed. For example, the native oxide layer on the surfaces of the preliminary solder bumps 150P may be removed by coating a liquid flux on the preliminary solder bumps 150P. In such a case, a wettability of the solder patterns constituting the preliminary solder bumps 150P may be enhanced to improve an adhesive strength between the solder patterns and the pillars.

Alternatively, the native oxide layer on the surfaces of the preliminary solder bumps 150P may be removed by a fluxless process that is performed using a forming gas or a nitrogen gas as a process gas.

Referring to FIG. 1G, a reflow process may be applied to the substrate where the bump mask 146 is removed. The reflow process may be performed at a temperature of about 200° C. to about 300° C. The solder patterns of the preliminary solder bumps (150P of FIG. 1F) may be reshaped by the reflow process to form solder bumps 150, each of which includes the pillar and a reshaped solder pattern having a semi-spherical shape.

In some embodiments, the solder bumps 150 may be formed to have a first height $t_1$ of about a few micrometers to about several tens of micrometers. However, in some embodiments, the first height $t_1$ of the solder bumps 150 may be out of the range of a few micrometers to about several tens of micrometers.

After the reflow process is performed to form the solder bumps 150, the first front side pads 130 may not be exposed because of the presence of the seed metal layer 140P which is located under the solder bumps 150.

As a result of the reflow process, a pre-package 100P including the solder bumps 150 formed on the seed metal layer 140P may be fabricated. For example, the pre-package 100P may be a bumped package or a bumped wafer that includes solder bumps which are formed by a reflow process. The pre-package 100P may include the seed metal layer 140P which is formed on an entire portion of the first surface F1 of the first substrate 110 and the solder bumps 150 which are formed on the seed metal layer 140P. The pre-package 100P may further include the through-substrate vias 134 therein, and the through-substrate vias 134 may not be exposed at a surface of the pre-package 100P. For example, the through-substrate vias 134 may be buried by an insulating layer 120, front side pads 130 and/or solder bumps 150.

Referring to FIG. 1H, a light-to-heat conversion layer 152 may be formed on the seed metal layer 140P and the solder bumps 150. The light-to-heat conversion layer 152 may be coated by a spin coating process. In such a case, the light-to-heat conversion layer 152 may be conformably formed on the seed metal layer 140P and the solder bumps 150. The light-to-heat conversion layer 152 may include a material that converts optical energy of laser beams irradiated in a subsequent process into thermal energy. For example, the light-to-heat conversion layer 152 may include a laser beam absorbing material. Alternatively, the light-to-heat conversion layer 152 may be formed to include a thermoplastic material such as an acrylic resin material.

A support substrate 156 may be attached to a top surface of the light-to-heat conversion layer 152 using an adhesive member 154. Accordingly, the light-to-heat conversion layer 152 and the adhesive member 154 may be sequentially stacked between each solder bump 150 and the support substrate 156.

In some embodiments, after the adhesive member 154 is applied onto the light-to-heat conversion layer 152, the support substrate 156 may be attached to the adhesive member 154. For example, the adhesive member 154 may be formed to include an adhesive such as a thermoplastic organic material using a spin coating process. For example, a liquid adhesive material having relatively low viscosity may then be coated on the light-to-heat conversion layer 152, and the liquid adhesive material may be heated to form a gelled adhesive member 154 that covers the solder bumps 150. The adhesive member 154 may be formed to have a second height $t_2$ which is greater than the first height $t_1$ of the solder bumps 150 and may be formed to substantially cover the entire top surface of the first substrate 110. Accordingly, the adhesive member 154 may provide a stable and solid adhesive strength between the first substrate 110 and the support substrate 156. The adhesive member 154 may also be referred to herein as an adhesive layer.

Alternatively, the adhesive member 154 may be formed to include an ultraviolet (UV) curable material using a spin coating process. For example, a liquid adhesive material having relatively low viscosity may be coated on the light-to-heat conversion layer 152, and a UV ray may be irradiated onto the liquid adhesive material to form a gelled adhesive member 154 that covers the solder bumps 150.

In some other embodiments, after the adhesive member 154 is attached to the support substrate 156, the adhesive member 154 may be attached to the light-to-heat conversion layer 152 so that the support substrate 156 is combined with the first substrate 110.

The support substrate 156 may be formed to include a transparent insulation substrate such as a glass substrate or a sapphire substrate, a transparent conductive substrate, or a semiconductor substrate. When the support substrate 156 is formed to include a transparent substrate, laser beams irradiated onto the support substrate 156 in a subsequent process may pass through the support substrate 156 to reach the light-to-heat conversion layer 152. In certain embodiments, the support substrate 156 may be formed of a firm and solid material. Thus, the support substrate 156 may stably support the first substrate 110 while a backside portion of the first substrate 110 is ground to expose the through-substrate vias 134 in a subsequent process.

Referring to FIG. 1I, the resultant where the support substrate 156 is attached to the pre-package 100P may be flipped so that the second surface F2 of the first substrate 110 faces upwardly. Subsequently, a backside portion of the first substrate 110 may be processed to remove a portion of the substrate 110, for example, the backside portion may be ground using a grinding apparatus 158.

In some embodiments, the back grinding process applied to the first substrate 110 may terminate before the through-substrate vias 134 are exposed. As a result of the back grinding process, the first substrate 110 may be ground to have a third thickness $t_3$. The second surface F2 of the first substrate 110 may be recessed to provide a third surface F3 after the backside portion of the first substrate 110 is ground. For example, the third surface F3 of the first substrate 110 may be located at a level which is higher than top surfaces of the through-substrate vias 134 of the flipped pre-package 100P.

Although not shown in the drawings, in some embodiments, the backside portion of the first substrate 110 may be partially removed at first. For example, the backside portion of the outer periphery region OPR may be first removed to have the third thickness $t_3$ or less, and then, the other portion of backside of the first substrate 110 may be removed until the first substrate 110 in the semiconductor chip regions CR has the third thickness $t_3$. For example, the whole backside portion may be ground for the first substrate 110 to have a third thickness $t_3$ or less. In such a case, cracks or chips in the first substrate 110 may be reduced or prevented while the backside portion of the first substrate 110 is entirely ground.

Referring to FIG. 1J, a wet etch process may be applied to the third surface F3 of the first substrate 110 to expose the top surfaces of the through-substrate vias 134. In some embodiments, when the first substrate 110 includes silicon, the wet etch process may be performed using a wet etchant in which the etch rate of the silicon material is higher than the etch rate of the through-substrate vias 134 until the top surfaces of the through-substrate vias 134 are exposed. As a result, the first substrate 110 may become thinner to have a fourth thickness $t_4$ which is less than the third thickness $t_3$.

Subsequently, a second passivation layer 160 may be formed on the exposed surfaces of the through-substrate vias 134 and the third surface F3 of the first substrate 110. The second passivation layer 160 may be formed to include an insulation material, for example, a material including polyimide, silicon nitride, or silicon oxynitride.

Referring to FIG. 1K, first backside pads 162 electrically connected to the through-substrate vias 134 may be formed. For example, portions of the second passivation layer 160 may be removed to expose the top surfaces of the through-substrate vias 134. A conductive layer (not shown) may then be formed on the second passivation layer 160 and the through-substrate vias 134, and the conductive layer may be patterned to form the first backside pads 162 on the exposed top surfaces of the through-substrate vias 134.

Referring to FIG. 1L, the bond structure of the first substrate 110 and the support substrate 156 may be flipped so that the support substrate 156 face upwardly, and the bond structure may be attached to a dicing frame 172 and a dicing tape 174 attached to the dicing frame 172.

The dicing frame 172 may be a circular frame having a diameter greater than the diameter of the first substrate 110. The dicing tape 174 may be attached to a bottom surface of the dicing frame 172, and the first backside pads 162 may be attached to the dicing tape 174 so that the third surface F3 of the first substrate 110 faces the dicing tape 174.

Unlike the configuration illustrated in FIG. 1L, in certain embodiments, the bond structure of the first substrate 110 and the support substrate 156 may be temporarily attached and fixed to a vacuum chuck (not shown) instead of the dicing frame 172 and the dicing tape 174. In some other embodiments, bottom surfaces of the dicing frame 172 and the dicing tape 174 opposite to the first substrate 110 may be attached and fixed to a vacuum chuck (not shown).

Referring to FIG. 1M, laser beams may be irradiated onto the support substrate 156 using a laser generation apparatus 176. The laser generation apparatus 176 may generate excimer laser beams, yttrium aluminium garnet (YAG) laser beams, or carbon oxide ($CO_2$) laser beams. However, in some embodiments, the laser beams generated from the laser generation apparatus 176 are not limited to the excimer laser beams, the YAG laser beams or the $CO_2$ laser beams.

The laser beams irradiated onto the support substrate 156 may pass through the support substrate 156 and the adhesive member 154 to travel toward the first substrate 110, and a portion of the laser beams may be absorbed into the light-to-heat conversion layer 152 including a laser beam absorbing material. In contrast, another portion of the laser beams may be reflected by the seed metal layer 140P that is disposed under the light-to-heat conversion layer 152.

When the laser beams are irradiated onto the support substrate 156, the light-to-heat conversion layer 152 may be melted or evaporated by the laser beams to disappear as illustrate in FIG. 1N. Alternatively, when the laser beams are irradiated onto the support substrate 156, the light-to-heat conversion layer 152 may be partially melted or evaporated by the laser beams to remain between the adhesive member 154 and the solder bumps 150 and/or between the adhesive member 154 and the seed metal layer 140P. In such a case, the adhesive strength between the adhesive member 154 and the solder bumps 150 and/or between the adhesive member 154 and the seed metal layer 140P may be reduced.

Referring to FIG. 1N, when the light-to-heat conversion layer 152 may be melted or evaporated by the laser beams, a gap $S_1$ may be provided between the adhesive member 154 and the solder bumps 150 and/or between the adhesive member 154 and the seed metal layer 140P. In this case, the solder bumps 150 and/or the seed metal layer 140P may be spaced apart from the adhesive member 154 by the gap $S_1$.

As described above, the seed metal layer 140P may be formed to include metal. Thus, the seed metal layer 140P may act as a reflection layer that reflects the laser beams irradiated through the support substrate 156. The seed metal layer 140P may act as a thermal stress release layer that may reduce or suppress an instantaneous rise in temperature. Accordingly, even though the laser beams are irradiated through the support substrate 156, the seed metal layer 140P may protect the semiconductor device 122 from external heat because the seed metal layer 140P is formed on the entire portion of the first surface F1 of the first substrate 110 under the solder bumps 150, and the semiconductor device 122 is located under the seed metal layer 140P.

Referring to FIG. 1O, the support substrate 156 and the adhesive member 154 may be detached from the first substrate 110. As illustrated in FIG. 1N, since the gap $S_1$ exists between the adhesive member 154 and the solder bumps 150 as well as between the adhesive member 154 and the seed metal layer 140P, the support substrate 156 and the adhesive member 154 may be readily detached from the first substrate 110 even without aid of any mechanical force. Unlike the configuration illustrated in FIG. 1N, even though the light-to-heat conversion layer (152 of FIG. 1M) remains between the adhesive member 154 and the solder bumps 150 and/or between the adhesive member 154 and the seed metal layer 140P after the laser beams are irradiated onto the support substrate 156, the adhesive strength between the adhesive member 154 and the solder bumps 150 and/or between the adhesive member 154 and the seed metal layer 140P may be weak enough for the support substrate 156 and the adhesive member 154 to be easily detached. Thus, the support substrate 156 and the adhesive member 154 may be readily detached from the first substrate 110 even without aid of strong mechanical force.

The first front side pads 130, for example, including aluminum may still be covered with the seed metal layer 140P even after the support substrate 156 and the adhesive member 154 are detached from the first substrate 110. For example, since the seed metal layer 140P is disposed on the entire portion of the first surface F1 of the first substrate 110, the light-to-heat conversion layer 152 and the adhesive member 154 may not directly contact the first front side pads 130. If the light-to-heat conversion layer 152 or the adhesive member 154 including an organic material containing chlorine (Cl) directly contacts the first front side pads 130, organic residues may remain on the first front side pads 130 to chemically damage or corrode the first front side pads 130 when the light-to-heat conversion layer 152 or the adhesive member 154 is not completely removed. If the light-to-heat conversion layer 152 or the adhesive member 154 including an organic material containing chlorine (Cl) is removed using a cleaning solution containing fluorine (F), the first front side pads 130 may be chemically damaged or corroded by the cleaning solution containing fluorine (F). However, in some embodiments, the light-to-heat conversion layer 152 and the adhesive member 154 may not directly contact the first front side pads 130, as described above. Thus, the first front side pads 130 may not be chemically damaged or corroded by the organic residues or the cleaning solution due to the presence of the seed metal layer 140P.

Referring to FIG. 1P, the seed metal layer (140P of FIG. 1O) may be etched using the solder bumps 150 as etch masks, thereby leaving portions of the seed metal layer 140P under the solder bumps 150. The left portion of the seed metal layer 140P under the solder bumps 150 may correspond to under-bump metallurgy (UBM) patterns 140.

In some embodiments, the etch process for forming UBM patterns 140 may be performed using a wet etch technique with an etchant in which the etch rate of the seed metal layer 140P is higher than the etch rates of the solder bumps 150, the first front side pads 130 and the first passivation layer 132. However, the etch process for forming UBM patterns 140 is not limited to a wet etch technique. For example, in some embodiments, the etch process for forming UBM patterns 140 may be performed using a dry etch technique such as a reactive ion etch (RIE) technique.

Referring to FIG. 1Q, the first substrate 110 and the first insulating interlayer 120 may be sawn by a die sawing apparatus 178 along the scribe region SR to provide a plurality of separate semiconductor chips 100, each of which is illustrated in FIG. 1R. Subsequently, the individual semiconductor chip 100 may be mounted on a package substrate (not shown), and top surface and sidewalls of the individual semiconductor chip 100 may be encapsulated by a molding member (not shown) to provide a semiconductor package (not shown).

Back end processes or following processes for fabricating a stack package with the individual semiconductor chip 100 will be described fully with reference to FIGS. 6A to 6E later.

According to the embodiments described above, a method of fabricating a semiconductor package may include attaching the support substrate 156 to the pre-package 100P including the seed metal layer 140P for forming the solder bumps 150, grinding the second surface F2 of the first substrate 110, and removing the support substrate 156 using a laser irradiation process. The seed metal layer 140P may act as a reflection layer that reflects laser beams irradiated through the support substrate 156 during the laser irradiation process or may act as a thermal stress release layer that reduces or suppresses an instantaneous rise in temperature. Accordingly, the seed metal layer 140P may prevent the semiconductor device 122 from being damaged by the laser beams irradiated onto the support substrate 156.

In certain embodiments, the light-to-heat conversion layer 152 may be formed directly on the solder bumps 150 and the seed metal layer 140P. In such a case, the light-to-heat conversion layer 152 may be removed by the laser irradiation process to provide the gap $S_1$ between the adhesive member 154 and the solder bumps 150. Thus, the support substrate 156 may be readily removed even without aid of any mechanical force. Alternatively, even though the light-to-heat conversion layer 152 is partially removed by the laser irradiation process, the adhesive strength between the adhesive member 154 and the solder bumps 150 and/or between the adhesive member 154 and the seed metal layer 140P may become weaker as a result of the irradiation. For example, the adhesive strength may be made weak enough for the adhesive member 154 to be easily detached from the solder bumps 150 and/or the seed metal layer 140P. Thus, the support substrate 156 may be readily removed even without aid of strong mechanical force. Therefore, a mechanical stress applied to the semiconductor devices 122 and solder bumps 150 may be greatly reduced.

In certain embodiments, the light-to-heat conversion layer 152 and the adhesive member 154 may not directly contact the first front side pads 130 because of the presence of the seed metal layer 140P. Thus, the seed metal layer 140P may prevent the first front side pads 130 from being chemically damaged or corroded by organic residues contained in the light-to-heat conversion layer 152 (or the adhesive member 154) or a cleaning solution for removing the organic residues.

For example, the seed metal layer 140P for forming the solder bumps 150 may act as a protection layer of the semiconductor device 122 or the first front side pads 130. Thus, no additional process for forming an extra protection layer is required.

Figure 2A:
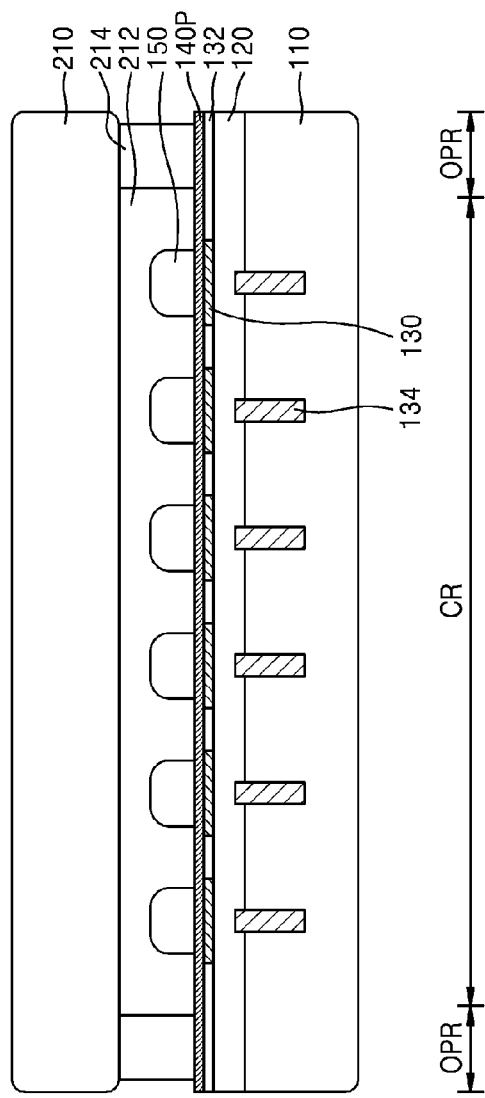
FIGS. 2A to 2C are cross-sectional views illustrating a method of manufacturing a semiconductor package according to another embodiment of the inventive concept.
Figure 2B:
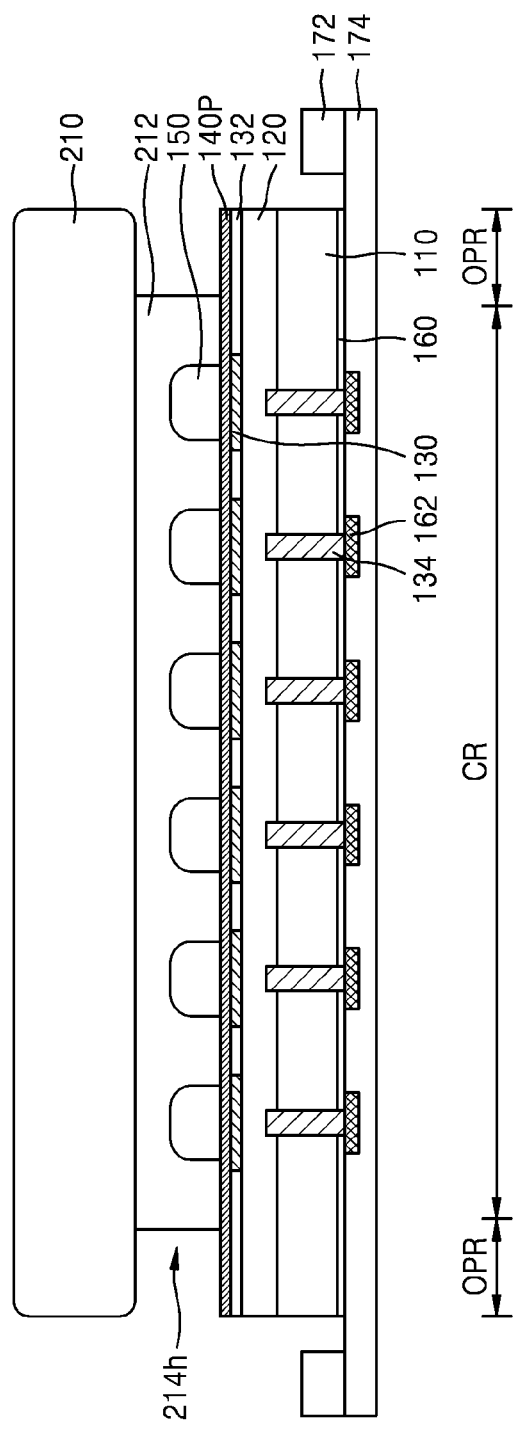
Figure 2C:
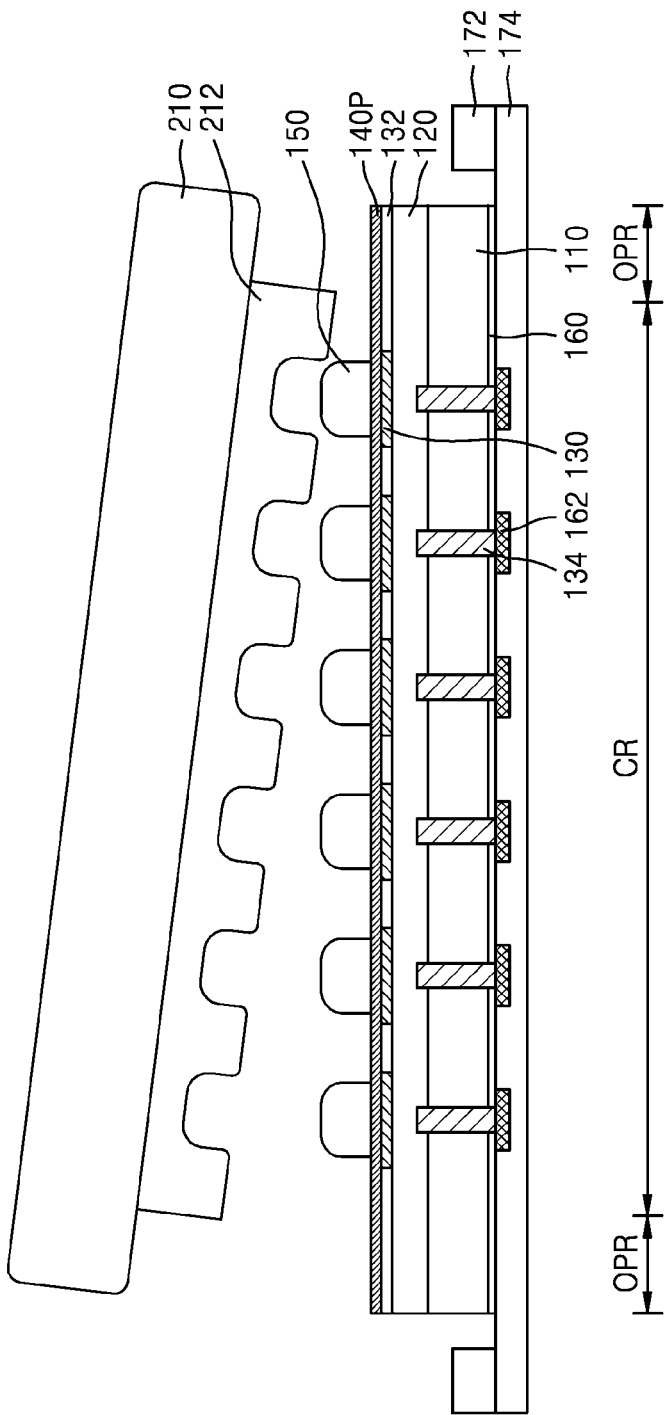

FIGS. 2A to 2C are cross-sectional views illustrating a method of manufacturing a semiconductor package according to another embodiment of the inventive concept. The present embodiment may be substantially the same as some previous embodiments described with reference to FIGS. 1A to 1R except that the support substrate may be removed using a debonding solvent. Thus, for the purpose of simplification in explanation, the following description will focus on differences between the present embodiment and the previous embodiments. For example, an element or a process not mentioned with regard to this embodiment may be the same as one of the other embodiments. In FIGS. 2A to 2C, the same reference numerals as used in FIGS. 1A to 1R indicate the same or similar elements.

First, the pre-package 100P may be formed using the same processes as described with reference to FIGS. 1A to 1G.

Referring to FIG. 2A, a support substrate 210 may be attached to the seed metal layer 140P and the solder bumps 150 using a first adhesive member 212 and a second adhesive member 214.

In some embodiments, the support substrate 210 may be formed to include a transparent substrate or an opaque substrate. The transparent substrate may be a glass substrate, a sapphire substrate or a transparent conductive substrate, and the opaque substrate may be a silicon substrate or an alumina substrate.

In some embodiments, the first adhesive member 212 may be formed of a material which is different from the material of the second adhesive member 214. As illustrated in FIG. 2A, the first adhesive member 212 may be formed on the semiconductor chip region CR of the first substrate 110, and the second adhesive member 214 may be formed on the outer periphery region OPR of the first substrate 110. For example, the first adhesive member 212 may be formed to extend from a central point of the first substrate 110 toward an edge of the first substrate 110 by a predetermined distance, and the second adhesive member 214 may be formed to have an annular shape that surrounds the first adhesive member 212 along the edge of the first substrate 110. In such a case, the first adhesive member 212 may be formed of a material having a relatively low adhesive strength, and the second adhesive member 214 may be formed of a material having a relatively high adhesive strength. For example, in one embodiment, the first adhesive member 212 has a lower adhesive strength than that of the second adhesive member 214. Since the second adhesive member 214 is disposed along the outer periphery region OPR of the first substrate 110, the support substrate 210 may be firmly attached to the first substrate 110.

In some other embodiments, the first adhesive member 212 may be formed to include an organic material that hardly has an adhesive strength, and the second adhesive member 214 may be formed to include an organic material that has a relatively high adhesive strength.

Subsequently, the first backside pads 162, the dicing frame 172 and the dicing tape 174 may be formed and attached to the first substrate 110 using the same manners as described with reference to FIGS. 1I to 1L.

Referring to FIG. 2B, a debonding solvent may be supplied onto the bond structure of the first substrate 110 and the support substrate 210 to remove the second adhesive member (214 of FIG. 2A). The debonding solvent may be an organic solvent which is capable of dissolving the second adhesive member 214. In some embodiments, the debonding solvent may be supplied onto sidewalls of the bond structure of the first substrate 110 and the support substrate 210 using a nozzle of a spray (not shown). Alternatively, the debonding solvent may be supplied onto the bond structure of the first substrate 110 and the support substrate 210 by dipping the bond structure into the debonding solvent. When the second adhesive member 214 is removed, a gap 214h may be provided between an edge of the support substrate 210 and the outer periphery region OPR of the first substrate 110.

In some embodiments, the debonding solvent may be selectively supplied onto only a portion of the second adhesive member 214 which is adjacent to an interface between the second adhesive member 214 and the first substrate 110. In such a case, the second adhesive member 214 may not be completely removed, and a portion of the second adhesive member 214 may be left unlike FIG. 2B. For example, a portion of the second adhesive member 214 which is adjacent to an interface between the support substrate 210 and the second adhesive member 214 may remain, and only a portion of the second adhesive member 214 which is adjacent to an interface between the second adhesive member 214 and the first substrate 110 may be removed to provide the gap 214h between the remaining second adhesive member 214 and the first substrate 110.

Referring to FIG. 2C, the support substrate 210 and the first adhesive member 212 may be detached from the first substrate 110. For example, in certain embodiments, because the first adhesive member 212 hardly has an adhesive strength or has a relatively low adhesive strength, the first adhesive member 212 may be readily detached from the solder bumps 150 and the seed metal layer 140P either without aid of any mechanical force other than a force sufficient to lift the weight of the support substrate 210 and first adhesive member 212, or with only a small amount of force. For example, gravity alone may be sufficient to separate the support substrate 210 and first adhesive member 212 from the solder bumps 150 and the seed metal layer 140P, so long as one of those portions is held in place above the other portion. Alternatively, the support substrate 210 and first adhesive member 212 may be peeled away from the solder bumps 150 and the seed metal layer 140P using a small amount of externally applied force.

Optionally, a cleaning process for removing residues of the first adhesive member 212 or the second adhesive member 214 may be additionally performed after the support substrate 210 and the first adhesive member 212 are detached from the first substrate 110. During the cleaning process, the first front side pads 130 may not be exposed to a cleaning solution used in the cleaning process because the first front side pads 130 are covered by the seed metal layer 140P. Thus, the seed metal layer 140P may prevent the first front side pads 130 from being chemically damaged or corroded by the cleaning solution used in the cleaning process.

Subsequently, the same processes as described with reference to FIGS. 1P and 1Q may be applied to the resultant where the support substrate 210 and the first adhesive member 212 are detached from the first substrate 110. For example, the seed metal layer (140P of FIG. 2C) may be etched using the solder bumps 150 as etch masks, thereby forming UBM patterns 140 under the solder bumps 150, and the first substrate 110 and the first insulating interlayer 120 may be sawn using a die sawing process along the scribe region SR to provide the plurality of separate semiconductor chips 100, each of which is illustrated in FIG. 1R.

Figure 3A:
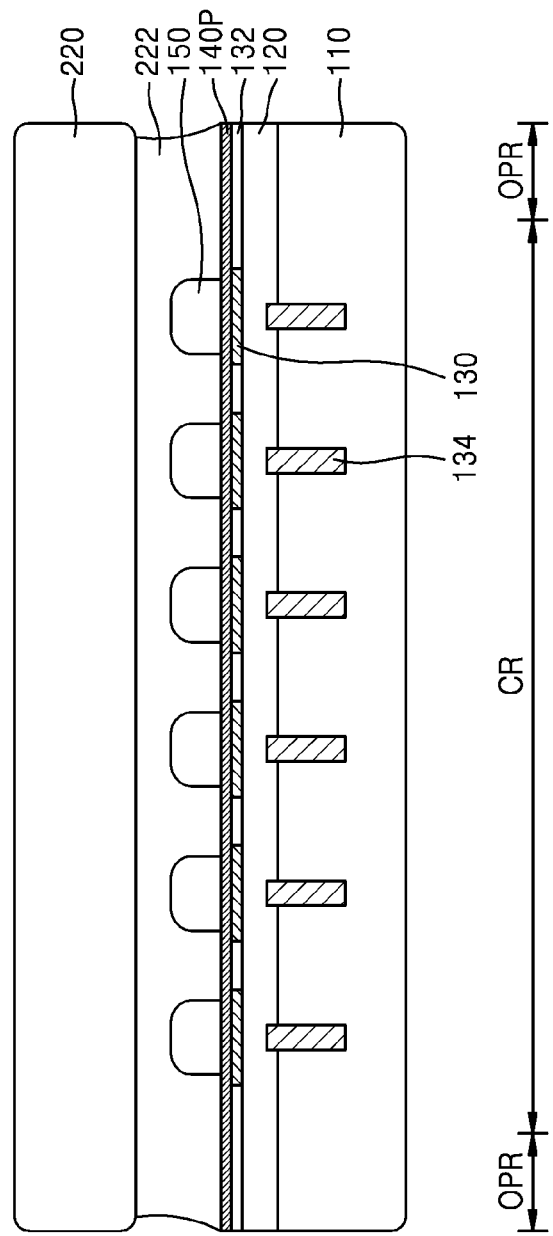
FIGS. 3A and 3B are cross-sectional views illustrating a method of manufacturing a semiconductor package according to yet another embodiment of the inventive concept.
Figure 3B:
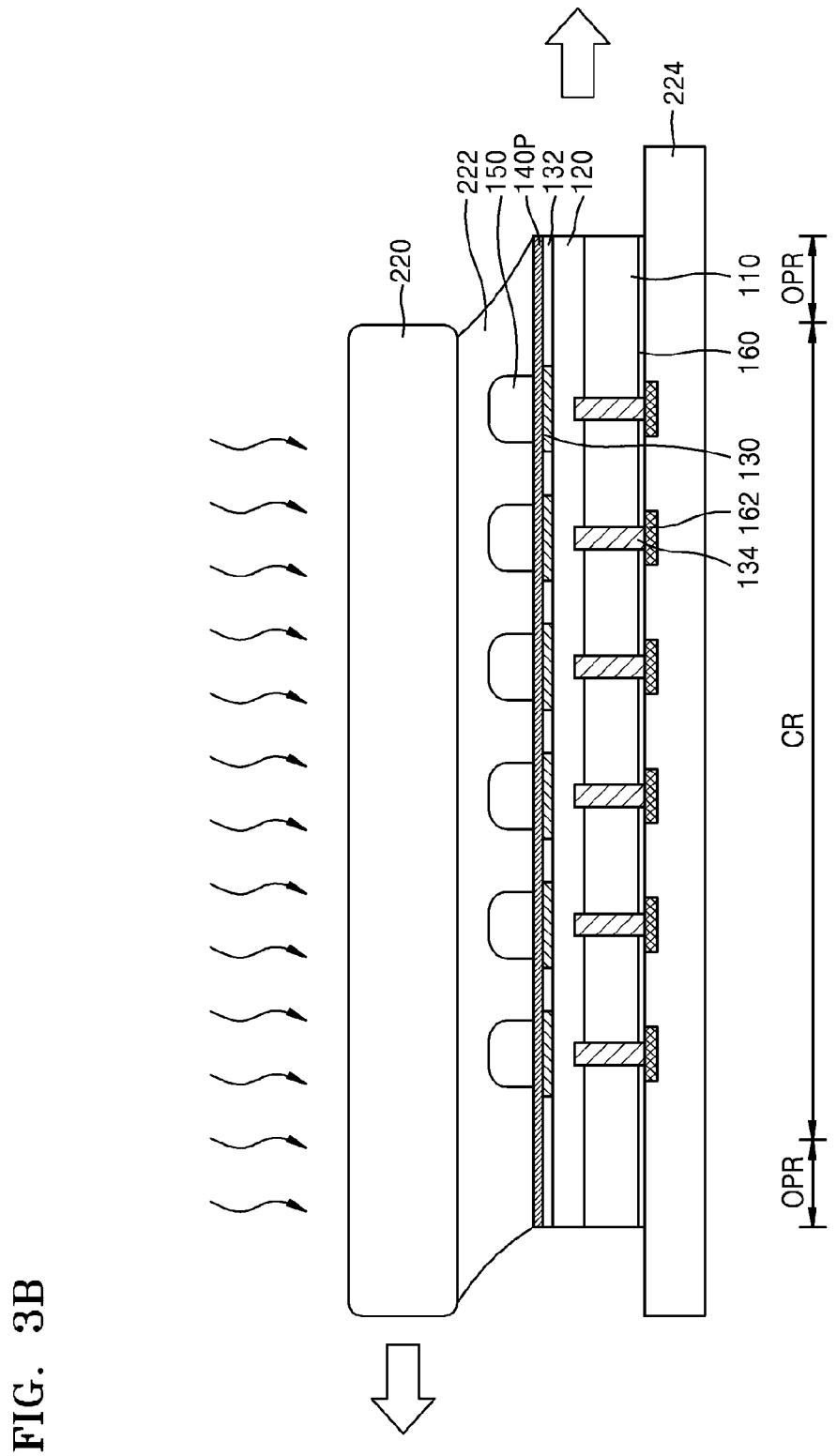

FIGS. 3A and 3B are cross-sectional views illustrating a method of manufacturing a semiconductor package according to yet another embodiment of the inventive concept. The present embodiment may be substantially the same as some previous embodiments described with reference to FIGS. 1A to 1R except that a support substrate may be removed using a pushing force (or a pulling force). Thus, for the purpose of simplification in explanation, the following description will focus on differences between the present embodiment and the previous embodiments illustrated in FIGS. 1A to 1R. For example, an element or a process not mentioned with regard to this embodiment may be the same as one of the other embodiments.

First, the pre-package 100P may be formed using the same processes as described with reference to FIGS. 1A to 1G.

Referring to FIG. 3A, a support substrate 220 may be attached to the seed metal layer 140P and the solder bumps 150 using an adhesive member 222. In some embodiments, the adhesive member 222 may be formed to include a thermoplastic material. For example, the adhesive member 222 may be formed to include a material whose viscosity is reduced if the material is heated. For example, the adhesive member 222 may have a debonding temperature corresponding to a temperature when a viscosity of the adhesive member 222 is less than a predetermined viscosity exhibiting fluidity of the adhesive member 222. For example, the debonding temperature of the adhesive member 222 may be within the range of about 100° C. to about 200° C. However, in some embodiments, the debonding temperature of the adhesive member 222 is not limited to the above temperature range.

Subsequently, the first backside pads 162 may be formed on the through-substrate vias 134 and the first substrate 110 may be fixed to a vacuum chuck 224, using the same manners as described with reference to FIGS. 1I to 1L.

Referring to FIG. 3B, after a bond structure of the support substrate 220 and the first substrate 110 is fixed to the vacuum chuck 224, the bond structure of the support substrate 220 and the first substrate 110 may be heated to the debonding temperature of the adhesive member 222. Physical forces (for example, a pushing force or a pulling force) may then be applied to the support substrate 220 and the first substrate 110 to detach the support substrate 220 from the first substrate 110. For example, a first physical force may be applied to the support substrate 220 in a first horizontal direction, which is parallel with a top surface of the first substrate 110, and a second physical force may be applied to the first substrate 110 in a second horizontal direction, which is opposite to the first horizontal direction. As a result, the support substrate 220 may horizontally slide because the viscosity of the adhesive member 222 between the support substrate 220 and the first substrate 110 is reduced to increase the fluidity of the adhesive member 222 while the bond structure is heated to the debonding temperature of the adhesive member 222. In FIG. 3B, the first and second physical forces are indicated by arrows.

Because the viscosity of the adhesive member 222 is reduced to increase the fluidity of the adhesive member 222 while the bond structure is heated to the debonding temperature of the adhesive member 222, the solder bumps 150 and the semiconductor device 122 may not be damaged by a mechanical stress when the support substrate 220 is detached from the first substrate 110.

Subsequently, a cleaning process may be additionally performed to remove residues of the adhesive member 222. During the cleaning process, the first front side pads 130 may not be exposed to a cleaning solution used in the cleaning process because the first front side pads 130 are covered by the seed metal layer 140P. Thus, the seed metal layer 140P may prevent the first front side pads 130 from being chemically damaged or corroded by the cleaning solution used in the cleaning process.

Subsequently, the same processes as described with reference to FIGS. 1P and 1Q may be applied to the resultant where the support substrate 220 and the adhesive member 222 are detached from the first substrate 110. For example, the seed metal layer (140P of FIG. 3B) may be etched using the solder bumps 150 as etch masks, thereby forming UBM patterns 140 under the solder bumps 150, and the first substrate 110 and the first insulating interlayer 120 may be sawn using a die sawing process along the scribe region SR to provide a plurality of separate semiconductor chips 100, each of which is illustrated in FIG. 1R.

FIGS. 4A to 4E are cross-sectional views illustrating a method of manufacturing a semiconductor package according to still another embodiment of the inventive concept. The present embodiment may be substantially the same as the previous embodiments described with reference to FIGS. 1A to 1R except that a metal protection layer is additionally formed. Thus, for the purpose of simplification in explanation, the following description will focus on differences between the present embodiment and the previous embodiment illustrated in FIGS. 1A to 1R. For example, an element or a process not mentioned with regard to this embodiment may be the same as one of the other embodiments.

First, the pre-package 100P may be formed using the same processes as described with reference to FIGS. 1A to 1G.

Figure 4A:
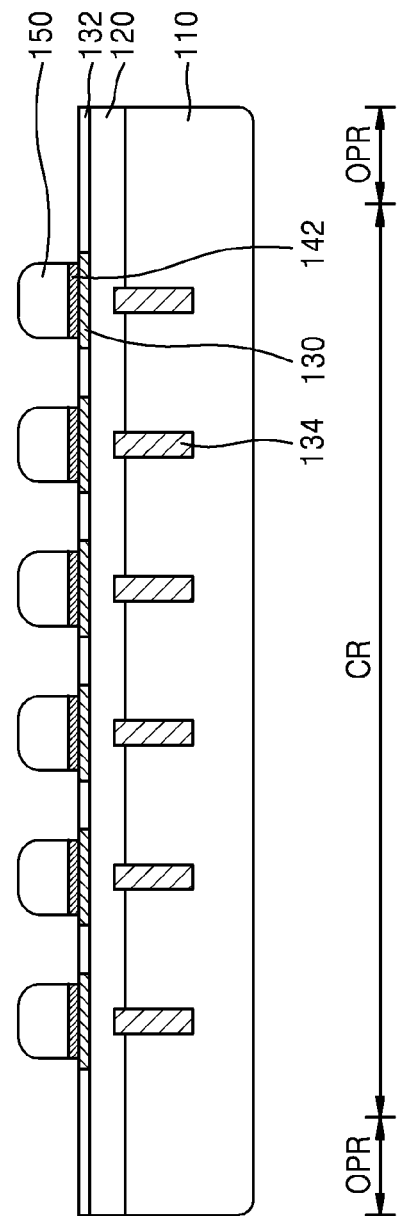
FIGS. 4A to 4E are cross-sectional views illustrating a method of manufacturing a semiconductor package according to still another embodiment of the inventive concept.

Referring to FIG. 4A, the seed metal layer (140P of FIG. 1G) may be etched using the solder bumps 150 as etch masks, thereby forming UBM patterns 142 under the solder bumps 150. As a result, a portion of the seed metal layer 140P not covered by the solder bumps 150 may be removed, and portions of the seed metal layer 140P covered by the solder bumps 150 may remain.

In some embodiments, the etch process for forming UBM patterns 142 may be performed using a wet etch technique with an etchant in which the etch rate of the seed metal layer 140P is higher than the etch rates of the solder bumps 150, the first front side pads 130 and the first passivation layer 132 (i.e., an etchant having an etch-selectivity for the seed metal layer 140P with respect to the solder bumps 150, the first side pads 130 and the first passivation layer 132). Although not shown in FIG. 4A, after and as a result of performance of the etch process for forming UBM patterns 142, undercut regions may be formed below edges of the solder bumps 150.

When the seed metal layer 140P is etched to form the UBM patterns 142, portions of the first passivation layer 132 may be exposed. In certain embodiments, as illustrated in FIG. 4A, edges of the first front side pads 130 may also be exposed after forming the UBM patterns 142 in a case where a width of the solder bumps 150 in a horizontal direction is less than a width of the first front side pads 130 in the horizontal direction.

Figure 4B:
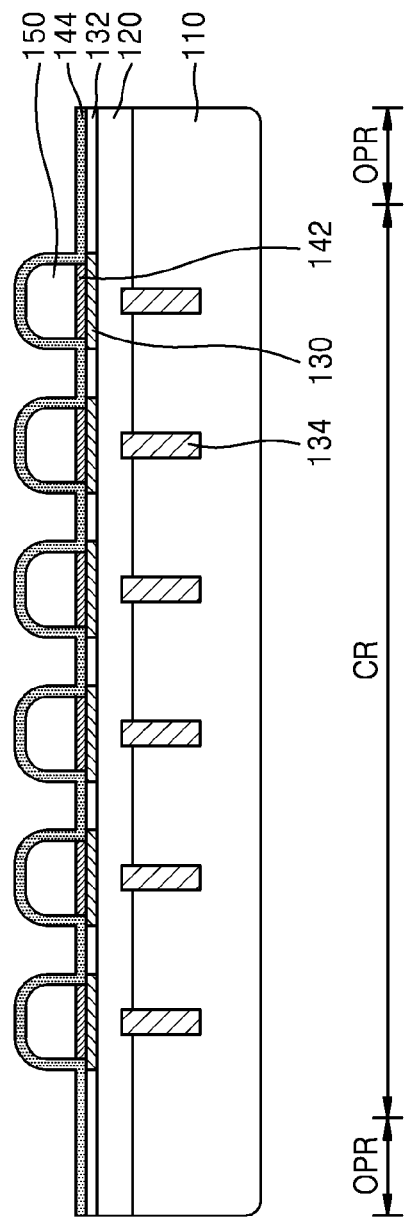

Referring to FIG. 4B, a metal protection layer 144 may be formed on the solder bumps 150 and the first passivation layer 132. The metal protection layer 144 may be formed to have a predetermined thickness to conformably cover the solder bumps 150. In some embodiments, the metal protection layer 144 may be formed of a material including chromium, nickel, titanium, titanium tungsten, tungsten, tantalum, ruthenium, copper, gold, silver, or a combination thereof. In certain embodiments, the metal protection layer 144 may be formed to include the same material as the seed metal layer 140P. In some other embodiments, the metal protection layer 144 may be formed to include a material different from the seed metal layer 140P.

Figure 4C:
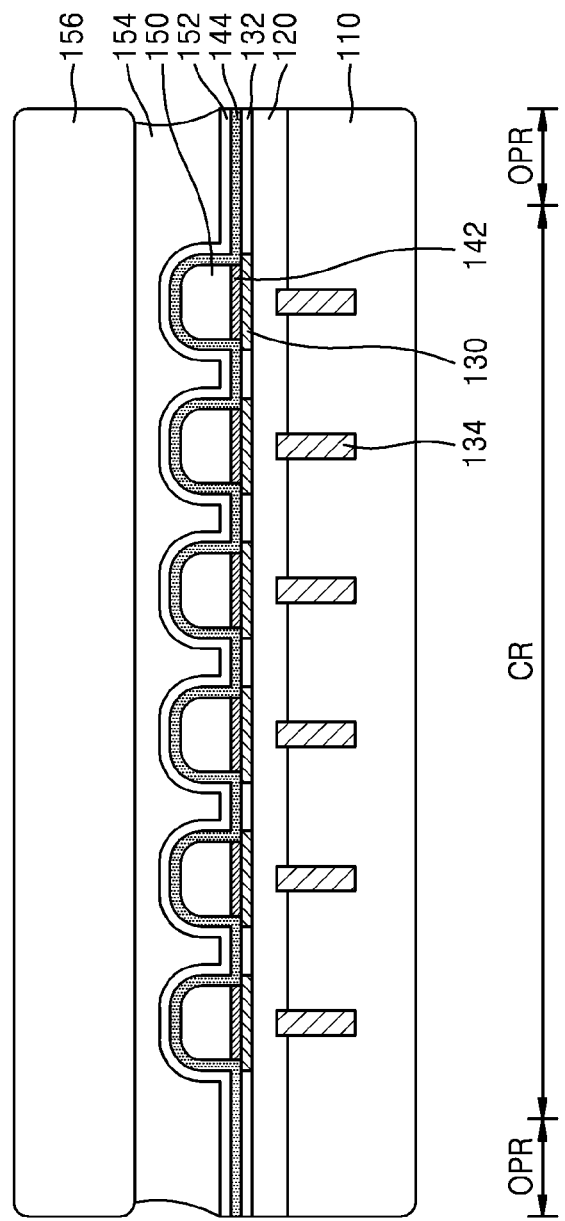

Referring to FIG. 4C, the light-to-heat conversion layer 152 may be formed on the metal protection layer 144, and the support substrate 156 may be attached to a top surface of the light-to-heat conversion layer 152 using an adhesive member 154.

Subsequently, first backside pads 162 may be formed on the through-substrate vias 134 using the same manners as described with reference to FIGS. 1I, 1J and 1K.

Figure 4D:
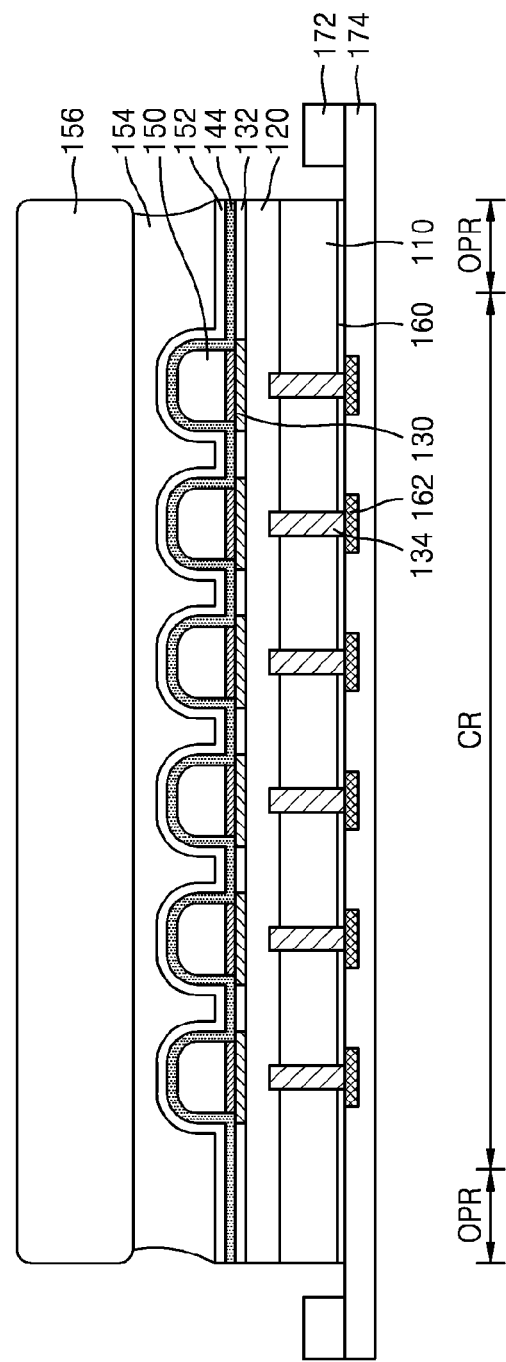

Referring to FIG. 4D, a bond structure of the first substrate 110 and the support substrate 156 may be attached to the dicing frame 172 and the dicing tape 174.

Figure 4E:
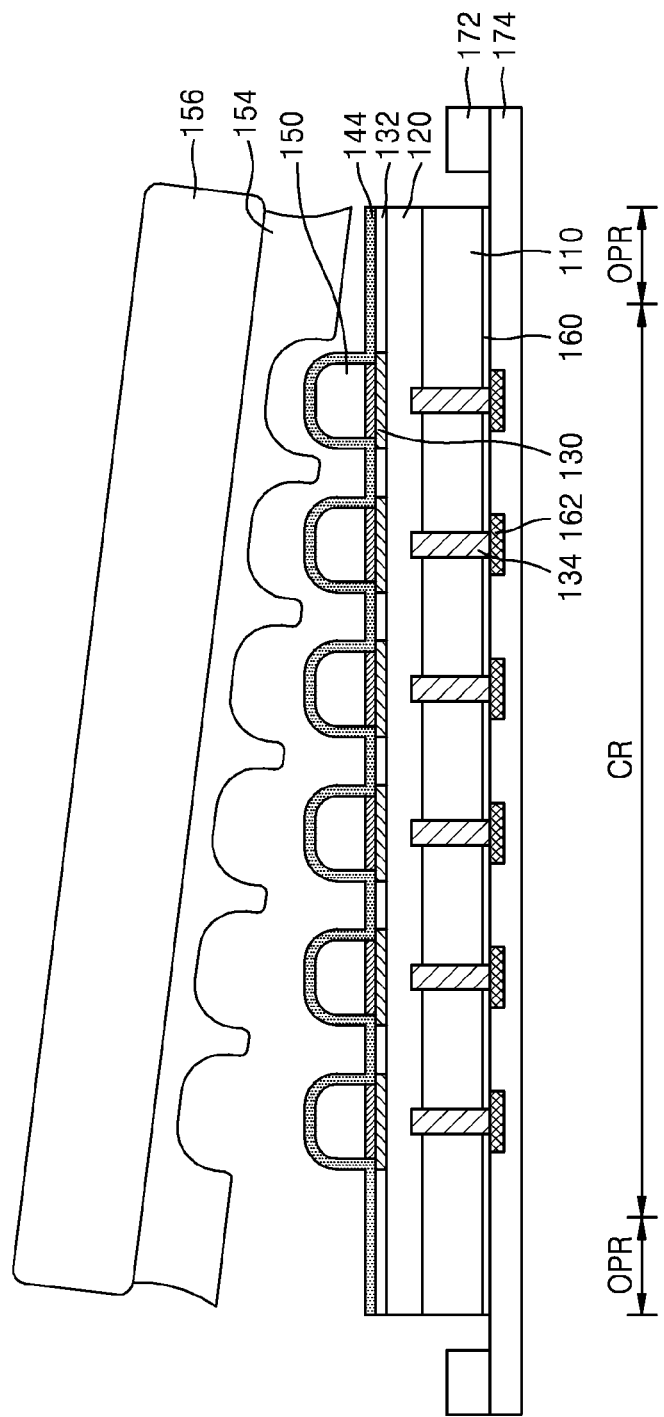

Referring to FIG. 4E, laser beams may be irradiated onto the support substrate 156 to remove the light-to-heat conversion layer 152. When the laser beams are irradiated onto the support substrate 156, the light-to-heat conversion layer 152 may be partially melted or evaporated by the laser beams to provide a gap between the metal protection layer 144 and the adhesive member 154.

Subsequently, the support substrate 156 and the adhesive member 154 may be separated from the metal protection layer 144 disposed on the first substrate 110. The metal protection layer 144 and the adhesive member 154 may not directly contact each other, or the light-to-heat conversion layer 152 may be partially melted to reduce an adhesive length between the adhesive member 154 and the metal protection layer 144. Thus, the solder bumps 150 and the semiconductor device 122 may not be damaged by a mechanical stress when the support substrate 156 is separated from the first substrate 110.

The metal protection layer 144 may include metal. Thus, the metal protection layer 144 may act as a reflection layer that reflects the laser beams irradiated through the support substrate 156. Moreover, the metal protection layer 144 may act as a thermal stress release layer that reduces or suppresses an instantaneous rise in temperature while the laser beams are irradiated through the support substrate 156.

The solder bumps 150 may be covered by the metal protection layer 144 while the support substrate 156 is attached and detached and the first substrate 110 is ground. Thus, the metal protection layer 144 may prevent the solder bumps 150 from being mechanically or chemically damaged while the support substrate 156 is attached and detached and the first substrate 110 is ground.

Subsequently, the metal protection layer 144 may be removed.

In some embodiments, the metal protection layer 144 may be removed using a wet etch technique with an etchant in which the etch rate of the metal protection layer 144 is higher than the etch rates of the solder bumps 150, the first front side pads 130 and the first passivation layer 132. However, in some other embodiments, the process for removing the metal protection layer 144 is not limited to a wet etch technique. For example, the metal protection layer 144 may be removed by a dry etch process.

Subsequently, the same processes as described with reference to FIGS. 1P and 1Q may be applied to the resultant where the metal protection layer 144 is removed. For example, the first substrate 110 and the first insulating interlayer 120 may be sawn using a die sawing process along the scribe region SR to provide a plurality of separate semiconductor chips 100, each of which is illustrated in FIG. 1R.

Figure 5:
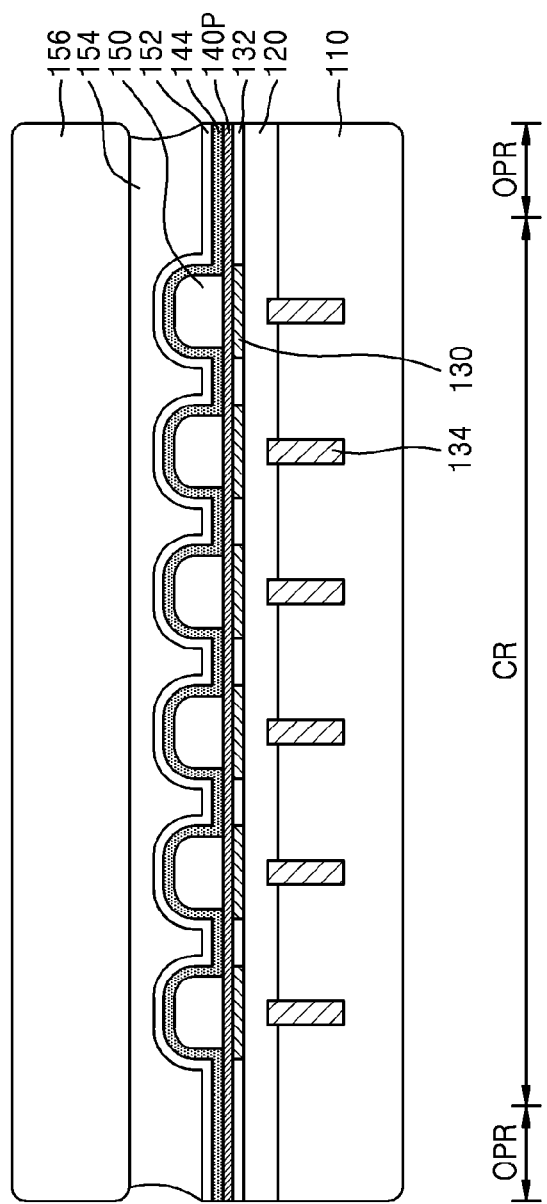
FIG. 5 is a cross-sectional view illustrating a method of manufacturing a semiconductor package according to yet still another embodiment of the inventive concept.

FIG. 5 is a cross-sectional view illustrating a method of manufacturing a semiconductor package according to yet still another embodiment of the inventive concept. The present embodiment may be substantially the same as the previous embodiments described with reference to FIGS. 1A to 1R except that a metal protection layer is additionally formed. Thus, for the purpose of simplification in explanation, the following description will focus on differences between the present embodiment and the previous embodiments illustrated in FIGS. 1A to 1R. For example, an element or a process not mentioned with regard to this embodiment may be the same as one of the other embodiments.

First, the pre-package 100P may be formed using the same processes as described with reference to FIGS. 1A to 1G.

Referring to FIG. 5, a metal protection layer 144 may be formed on the seed metal layer 140P and the solder bumps 150. The light-to-heat conversion layer 152 may then be formed on the metal protection layer 144, and the support substrate 156 may be attached to a top surface of the light-to-heat conversion layer 152 using the adhesive member 154.

Subsequently, the same processes as described with reference to FIGS. 1I to 1O may be applied to the resultant where the support substrate 156 is attached to the light-to-heat conversion layer 152.

For example, after the support substrate 156 is removed, the metal protection layer 144 may be exposed again. The metal protection layer 144 and the seed metal layer 140P which is not covered by the solder bumps 150 may be removed by an etching process. When the metal protection layer 144 and the seed metal layer 140P are formed of the same material, metal protection layer 144 and the seed metal layer 140P may be etched using a single step of wet etch process. Alternatively, when the metal protection layer 144 and the seed metal layer 140P are formed of different materials and the etchant for removing the metal protection layer 144 is different from the etchant for removing the seed metal layer 140P, the metal protection layer 144 and the seed metal layer 140P may be etched by sequentially performing a first wet etch process for removing the metal protection layer 144 and a second wet etch process for removing the seed metal layer 140P. According to the present embodiment, the solder bumps 150 may be covered by the metal protection layer 144 while the support substrate 156 is attached and detached and the first substrate 110 is ground. Thus, the metal protection layer 144 may prevent the solder bumps 150 from being mechanically or chemically damaged while the support substrate 156 is attached and detached and the first substrate 110 is ground.

In certain embodiments, the metal protection layer 144 may be removed while the seed metal layer 140P is etched. In this case, no additional process for removing the metal protection layer 144 is required.

Subsequently, the same processes as described with reference to FIGS. 1P and 1Q may be applied to the resultant where the metal protection layer 144 and the seed metal layer 140P are etched using the solder bumps 150 as etch masks. The first substrate 110 and the first insulating interlayer 120 may be sawn using a die sawing process along the scribe region SR to provide a plurality of separate semiconductor chips 100, each of which is illustrated in FIG. 1R.

FIG. 6A to 6E are cross-sectional views illustrating a method of manufacturing a semiconductor package according to further another embodiment of the inventive concept. The present embodiment provides methods of fabricating a semiconductor stack package 1000 using the semiconductor packages 100 fabricated by the embodiments described with reference to FIGS. 1A to 1R, FIGS. 2A to 2C, FIGS. 3A and 3B, FIGS. 4A to 4E, and FIG. 5.

Figure 6A:
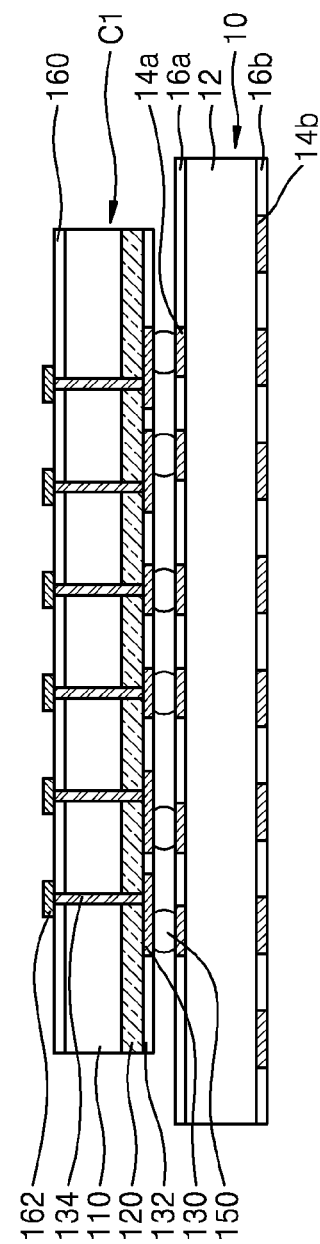
FIG. 6A to 6E are cross-sectional views illustrating a method of manufacturing a semiconductor package according to further another embodiment of the inventive concept.

Referring to FIG. 6A, a first semiconductor chip C1 may be attached to a package base substrate 10. The first semiconductor chip C1 may be any one of the semiconductor chips fabricated by the methods described with reference to FIGS. 1A to 1R, FIGS. 2A to 2C, FIGS. 3A and 3B, FIGS. 4A to 4E, and FIG. 5. Thus, detailed descriptions of the first semiconductor chip C1 will be omitted hereinafter.

The first semiconductor chip C1 may be attached to the package base substrate 10 so that a top surface (corresponding to the first surface F1 of the first substrate (110 of FIG. 1G) on which the semiconductor device 122 is formed) of the first semiconductor chip C1 faces the package base substrate 10. The first semiconductor chip C1 may be electrically connected to the package base substrate 10.

The package base substrate 10 may be, for example, a printed circuit board (PCB) or a lead frame. When the package base substrate 10 is a PCB, the package base substrate 10 may include a substrate base 12, first contact terminals 14a formed on a top surface of the substrate base 12, and second contact terminals 14b formed on a bottom surface of the substrate base 12. The first contact terminals 14a may be exposed at a top surface of a first solder resist layer 16a covering the top surface of the substrate base 12, and the second contact terminals 14b may be exposed at a bottom surface of a second solder resist layer 16b covering the bottom surface of the substrate base 12.

The substrate base 12 may include at least one selected from the group consisting of phenol resin, epoxy resin, and polyimide. For example, the substrate base 12 may include at least one selected from the group consisting of a flame retardant class 4 (FR4) material, a tetra-functional epoxy, a polyphenylene ether, an epoxy/polyphenylene oxide, a bismaleimide triazine (BT), a thermount, a cyanate ester, a polyimide, and a liquid crystal polymer. The first contact terminals 14a and the second contact terminals 14b may be formed of a material including copper, nickel, a stainless steel, or beryllium copper. Internal contact terminals (not shown) electrically connected to the first and second contact terminals 14a and 14b may be formed in the substrate base 12.

The first and second contact terminals 14a and 14b may correspond to exposed portions of circuit interconnection lines which are formed by coating copper foil on the top surface and the bottom surface of the substrate base 12 and by patterning the copper foil.

First solder bumps 150 may be disposed between the first contact terminals 14a and the first front side pads 130 to electrically connect the first contact terminals 14a to the first front side pads 130. The first solder bumps 150 may be combined with first contact terminals 14a using a thermo-compression bonding process or a reflow bonding process. The first semiconductor chip C1 may be electrically connected to the package base substrate 10 through the first solder bumps 150. It should be noted that although various bumps are described with respect to different embodiments herein as solder bumps, they may be generally referred to simply as bumps, or as conductive bumps, or more generally as terminals or conductive terminals.

Figure 6B:
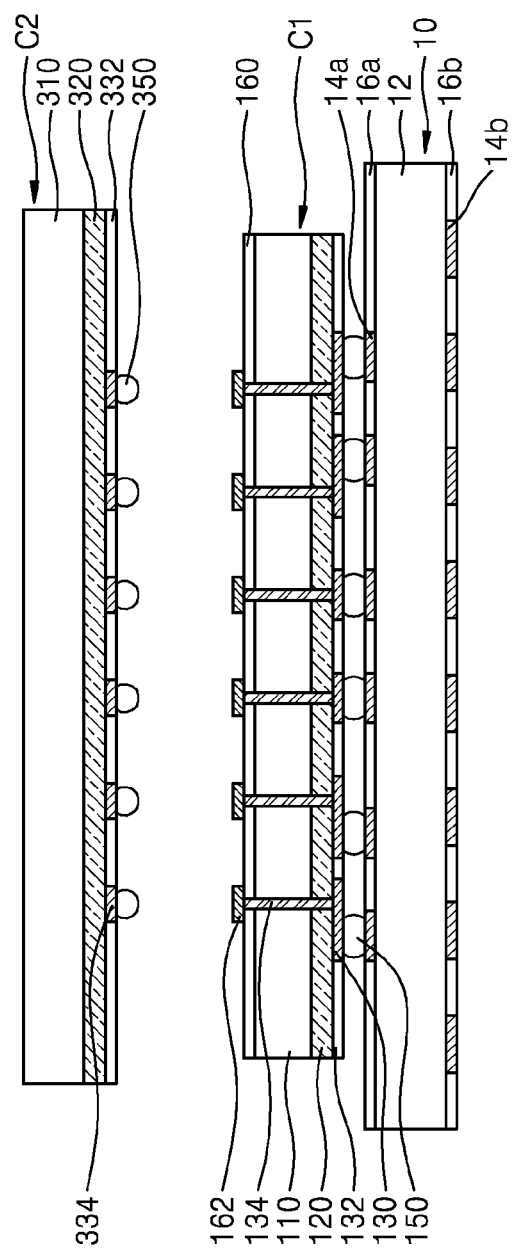

Referring to FIG. 6B, a second semiconductor chip C2 may be provided. The second semiconductor chip C2 may include a second substrate 310 and a semiconductor device (not shown) formed on the second substrate 310. An interconnection structure may be formed on the second substrate 310 to electrically connect the semiconductor device to other components, and a second insulating interlayer 320 may be formed on the second substrate 310 to cover the semiconductor device and the interconnection structure.

The semiconductor device of the second semiconductor chip C2 may be formed to include at least one of various devices. For example, the semiconductor device may be formed to include a CMOS circuit which is comprised of N-channel MOSFETs and P-channel MOSFETs. The semiconductor device may further include passive elements such as capacitors, resistors, and/or inductors. In some embodiments, the semiconductor device may be a system LSI device, an image sensor such as a CIS, or a MEMS.

The second semiconductor chip C2 may further include a plurality of second front side pads 334 which are electrically connected to the semiconductor device. The second front side pads 334 may be exposed at a surface of a second passivation layer 332 covering the second insulating interlayer 320. Connection bumps 350 may be formed on the second front side pads 334.

Figure 6C:
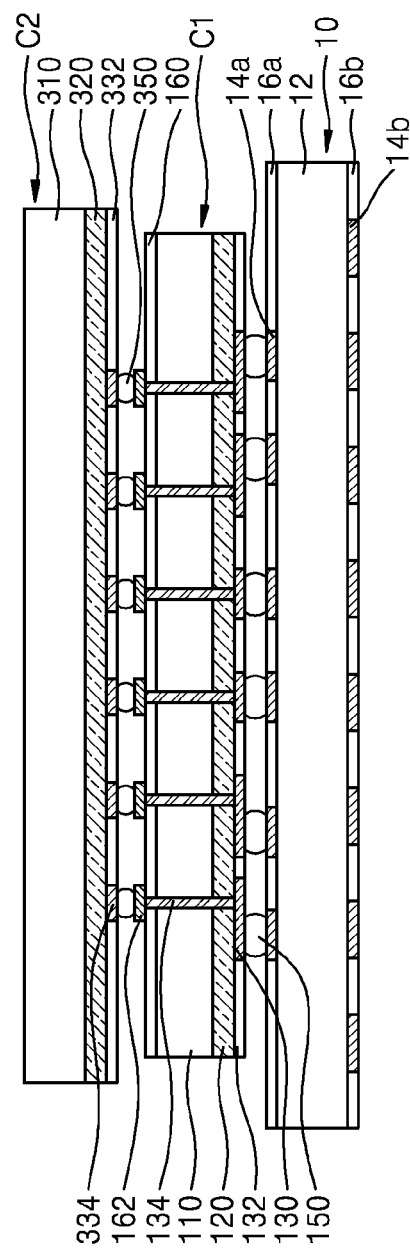

Referring to FIG. 6C, the second semiconductor chip C2 may be attached to the first semiconductor chip C1. The second semiconductor chip C2 may be attached to a top surface of the first semiconductor chip C1 and may be electrically connected to the through-substrate vias 134 of the first semiconductor chip C1.

The connection bumps 350 may be disposed between the first backside pads 162 and the second front side pads 334 to electrically connect the first backside pads 162 to the second front side pads 334. The first backside pads 162 may be combined with the second front side pads 334 using a thermo-compression bonding process or a reflow bonding process. The second semiconductor chip C2 may be electrically connected to the through-substrate vias 134 via the connection bumps 350. The second semiconductor chip C2 may be electrically connected to the package base substrate 10 via the through-substrate vias 134.

Figure 6D:
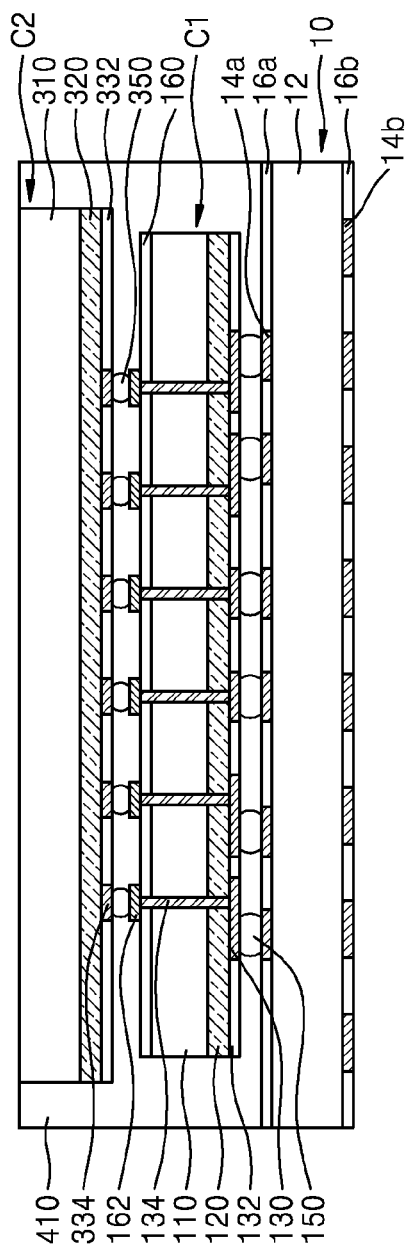

Referring to FIG. 6D, a molding template (not shown) may be attached to a top surface of the second semiconductor chip C2 opposite to the first semiconductor chip C1. The molding template, also referred to as a mold, may have a flat bottom surface to contact the entire portion of the top surface of the second semiconductor chip C2. Optionally, a buffer layer (not shown) may be additionally formed on the molding template and the second semiconductor chip C2 for tight contact between the molding template and the second semiconductor chip C2.

In some embodiments, a molding material may be injected into a space between the molding template and the package base substrate 10, for example, a space between the first semiconductor chip C1 and the package base substrate 10 as well as a space between the first semiconductor chip C1 and the second semiconductor chip C2, thereby forming a molding member 410. The molding member 410 may be formed by curing the molding material injected into the space between the molding template and the package base substrate 10. After the molding member 410 is formed, the molding template may be removed. The molding member 410, also referred to as a molding material structure, may be formed to cover sidewalls of the first and second semiconductor chips C1 and C2.

In some embodiments, the molding member 410 may be formed by injecting a molding material into a space between the first semiconductor chip C1 and the package base substrate 10 as well as a space between the first semiconductor chip C1 and the second semiconductor chip C2 using a molded underfill (MUF) process. Alternatively, an underfill layer (not shown) may be formed in a space between the first semiconductor chip C1 and the package base substrate 10 as well as a space between the first semiconductor chip C1 and the second semiconductor chip C2 using a capillary underfill process.

Figure 6E:
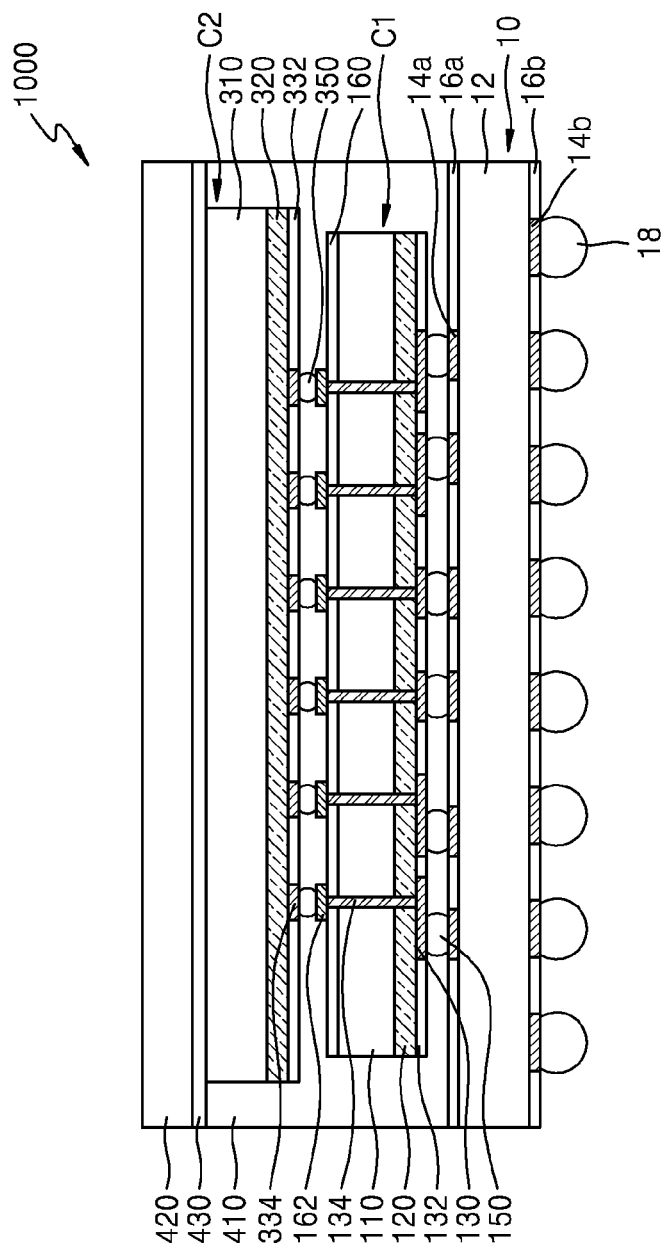

Referring to FIG. 6E, a heat dissipating member 420 may be formed on the top surface of the second semiconductor chip C2 opposite to the first semiconductor chip C1. The heat dissipating member 420 may be formed to cover all of the top surfaces of the second semiconductor chip C2 and the molding member 410. The heat dissipating member 420 may be a heat dissipating structure such as a heat slug or a heat sink. In some embodiments, a thermal interface material (TIM) 430 may be disposed between the second semiconductor chip C2 and the heat dissipating member 420. The TIM 430 may be formed, for example, of paste or a film. If a space exists between the second semiconductor chip C2 and the heat dissipating member 420, the TIM 430 may fill the space between the second semiconductor chip C2 and the heat dissipating member 420 to improve heat transfer efficiency of the heat dissipating member 420. Solder balls 18 may be formed on the second contact terminals 14b of the package base substrate 10.

As a result of the above processes, a semiconductor stack package 1000 may be completed.

Figure 7:
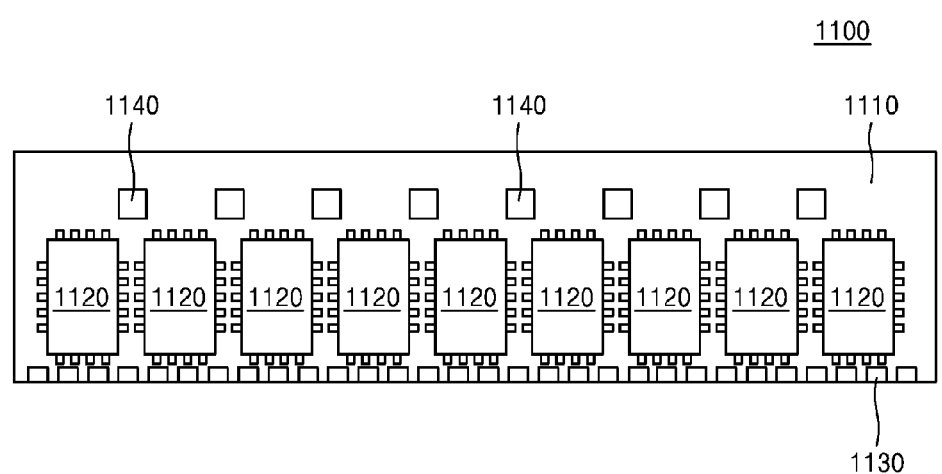
FIG. 7 is a plan view illustrating a memory module including at least one of semiconductor packages manufactured according to some embodiments.

FIG. 7 is a plan view illustrating a configuration of a memory module 1100 including at least one of the semiconductor packages described herein manufactured according to one of the exemplary embodiments.

Referring to FIG. 7, the memory module 1100 may include a module substrate 1110 and a plurality of semiconductor packages 1120 mounted on the module substrate 1110.

At least one of the semiconductor packages 1120 may correspond to any one of the semiconductor packages according to the above embodiments. For example, the semiconductor packages 1120 may include at least one of the semiconductor packages 100 fabricated by the embodiments described with reference to FIGS. 1A to 1R, FIGS. 2A to 2C, FIGS. 3A and 3B, FIGS. 4A to 4E, and FIG. 5 or may include the semiconductor stack package 1000 fabricated by the embodiment described with reference to FIGS. 6A to 6E.

A plurality of connectors 1130 may be disposed on one edge of the module substrate 1110, and the plurality of connectors 1130 may be inserted into a socket of a main board corresponding to a mother board. A plurality of ceramic decoupling capacitors 1140 may be disposed on the module substrate 1110. The memory module 1100 is not limited to the configuration illustrated in FIG. 7. That is, the memory module 1100 may be embodied in many different forms.

Figure 8:
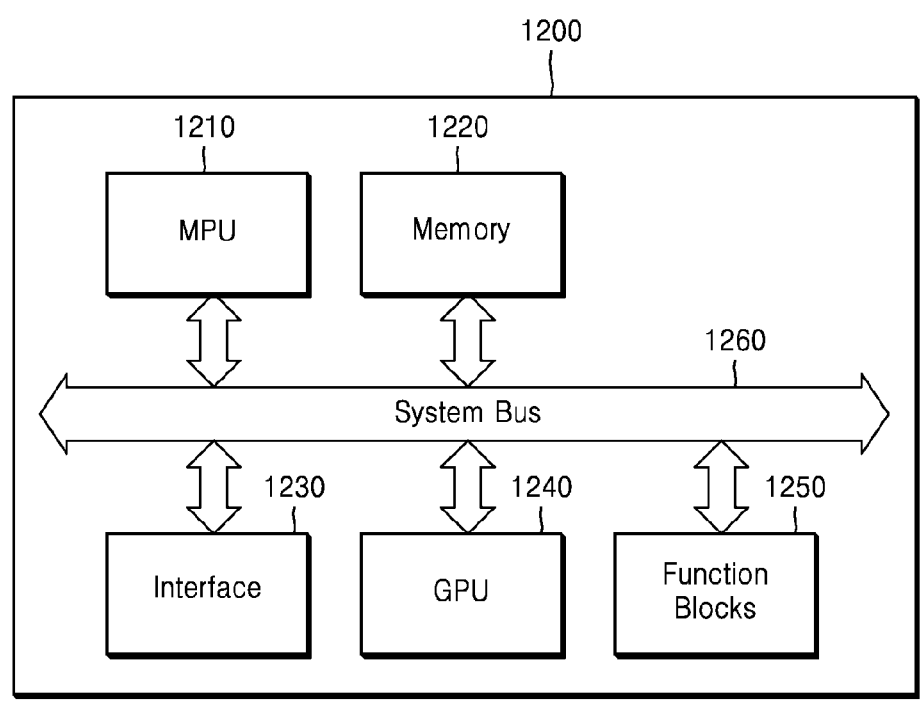
FIG. 8 is a block diagram illustrating a configuration of a semiconductor package according to an embodiment.

FIG. 8 is a block diagram illustrating a configuration of a semiconductor package 1200 according to an exemplary embodiment.

Referring to FIG. 8, the semiconductor package 1200 may include a micro processing unit (MPU) 1210, a memory 1220, an interface unit 1230, a graphic processing unit (GPU) 1240, function blocks 1250, and a system bus 1260. The MPU 1210, the memory 1220, the interface unit 1230, the GPU 1240, and the function blocks 1250 may be coupled with one another through the system bus 1260. In some embodiments, the semiconductor package 1200 may include only one of the MPU 1210 and the GPU 1240.

The MPU 1210 may include a processor and an L2 cache memory. For example, the MPU 1210 may include a multi-core processor. Two or more cores of the multi-core processor may have the same performance or different performances. In certain embodiments, the cores of the multi-core processor may be simultaneously activated or may be activated at different points of time. The memory 1220 may store data, which is generated from the function blocks 1250 under control of the MPU 1210. For example, when data stored in the L2 cache memory of the MPU 1210 are flushed over, the flushed data may be stored in the memory 1220. The interface unit 1230 may transmit and receive data to and from an external network system. For example, the semiconductor package 1200 may communicate with a camera, a display (e.g. a liquid crystal display (LCD) unit or an organic light emitting display) or a speaker through the interface unit 1230.

The GPU 1240 may execute graphic operations. For example, the GPU 1240 may execute video codec operations or may process three dimensional graphic operations.

The function blocks 1250 may have various functions. For example, when the semiconductor package 1200 is an application processor (AP) used in mobile systems, a portion of the function blocks 1250 may execute communication operations.

The semiconductor package 1200 may be any one of the semiconductor packages 100 fabricated by the embodiments described with reference to FIGS. 1A to 1R, FIGS. 2A to 2C, FIGS. 3A and 3B, FIGS. 4A to 4E, and FIG. 5 or may be a semiconductor stack package 1000 fabricated by the embodiment described with reference to FIGS. 6A to 6E.

The semiconductor package 1200 may include the memory 1220 and at least one of the MPU 1210 and the GPU 1240, and heat generated from the MPU 1210 and/or the GPU 1240 may be quickly emitted toward an outside region of the semiconductor package 1200. Thus, a heat concentration phenomenon in the semiconductor package 1200 may be reduced or prevented to improve the reliability of the semiconductor package 1200. Accordingly, the semiconductor package 1200 may have high capacity, high performance, and high reliability.

Figure 9:
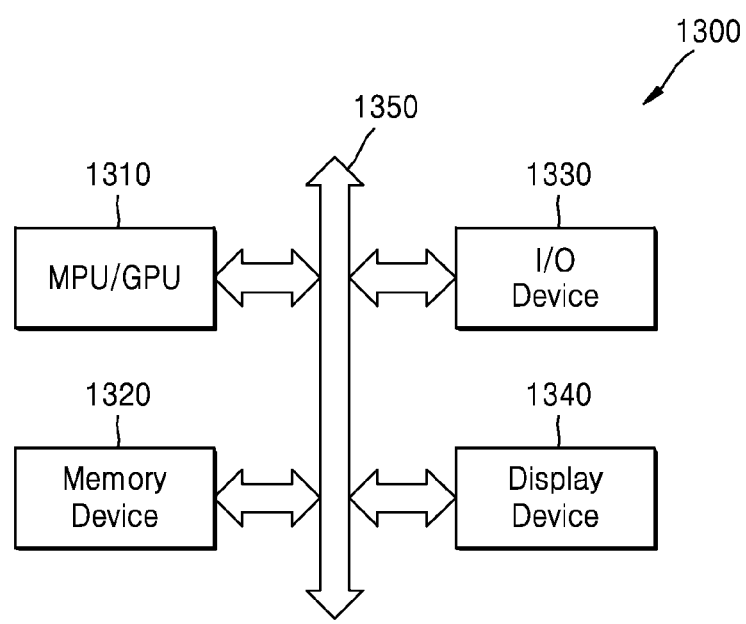
FIG. 9 is a block diagram illustrating an electronic system including at least one of semiconductor packages according to some embodiments.
Figure 10:
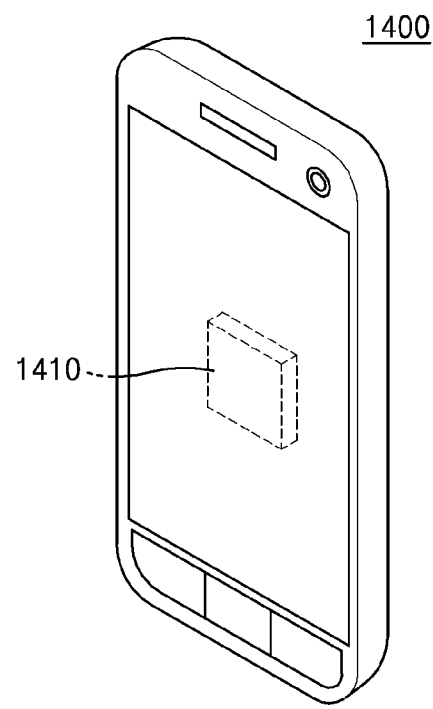

FIG. 9 is a block diagram illustrating an electronic system 1300 including at least one of the semiconductor packages according to the various disclosed embodiments.

Referring to FIG. 9, the electronic system 1300 may include an MPU/GPU module 1310. The electronic system 1300 may be, for example, a mobile system, a desk top computer, or a server. The electronic system 1300 may include a memory device 1320, an input/output (I/O) device 1330, and a display device 1340. The MPU/GPU module 1310, the memory device 1320, the I/O device 1330, and the display device 1340 may be coupled with a bus 1350. At least one of the MPU/GPU module 1310 and the memory device 1320 may be any one of the semiconductor packages 100 fabricated by the embodiments described with reference to FIGS. 1A to 1R, FIGS. 2A to 2C, FIGS. 3A and 3B, FIGS. 4A to 4E, and FIG. 5 or may be the semiconductor stack package 1000 fabricated by the embodiment described with reference to FIGS. 6A to 6E.

Even though the electronic system 1300 includes the MPU/GPU module 1310 and the memory device 1320, heat generated from the MPU/GPU module 1310 and/or the memory device 1320 may be quickly emitted toward an outside region of the electronic system 1300. Accordingly, the electronic system 1300 may have high reliability.

Figure 10:
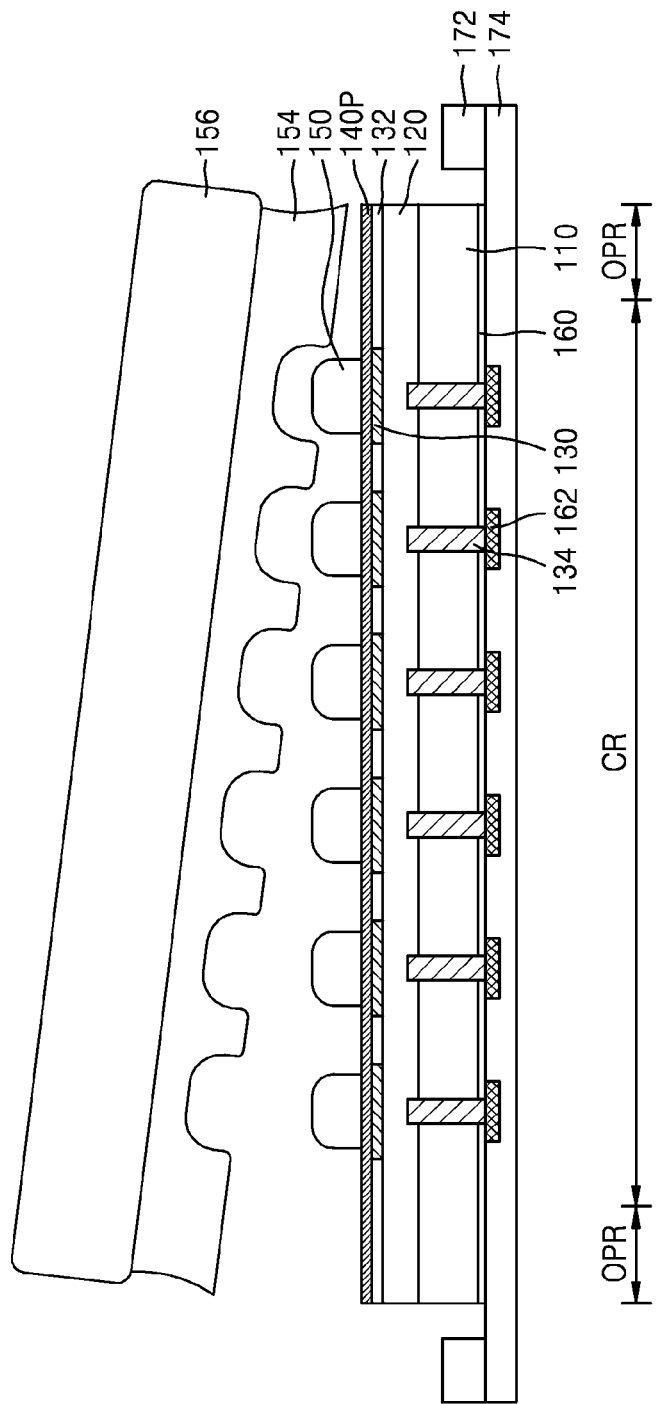
FIG. 10 is a perspective view illustrating an electronic device including at least one of semiconductor packages according to some embodiments.

FIG. 10 is a perspective view illustrating an electronic device 1400 including at least one of the semiconductor packages according to the various disclosed embodiments.

Referring to FIG. 10, the electronic device 1400 may be a mobile phone to which the electronic system 1300 of FIG. 9 is applied. The mobile phone 1400 may include a semiconductor package 1410. The semiconductor package 1410 may be any one of the semiconductor packages 100 fabricated by the embodiments described with reference to FIGS. 1A to 1R, FIGS. 2A to 2C, FIGS. 3A and 3B, FIGS. 4A to 4E, and FIG. 5 or may be the semiconductor stack package 1000 fabricated by the embodiment described with reference to FIGS. 6A to 6E.

The mobile phone 1400 may further include an MPU/GPU module and a memory device in addition to the semiconductor package 1410. Alternatively, the semiconductor package 1410 may include the MPU/GPU module and the memory device. In either case, the heat generated from the MPU/GPU module and/or the memory device may be quickly emitted toward an outside region of the semiconductor package 1410 or the mobile phone 1400. Accordingly, the mobile phone 1400 may be scaled down to provide a compact and high performance mobile phone.

In some other embodiments, the electronic system 1300 of FIG. 9 may be applied to portable computers, MP3 players, navigators, solid state disks (SSDs), automobiles, or household appliances.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure.

What is claimed is:

1. A method of fabricating a semiconductor package, the method comprising:
    forming a protection layer including metal continuously formed on a first surface of a substrate to cover a plurality of semiconductor devices that are disposed on the first surface of the substrate;
    attaching a support substrate to a top surface of the protection layer by using an adhesive member;
    processing a second surface of the substrate opposite to the protection layer to remove a portion of the substrate; and
    detaching the support substrate from the substrate,
    wherein the protection layer remains on the substrate after the support substrate is detached from the substrate.

2. The method of claim 1, further comprising forming bumps on the protection layer before the support substrate is attached to the protection layer,
    wherein the bumps are electrically connected to the semiconductor devices.

3. The method of claim 2, further comprising removing portions of the protection layer that are not covered by the bumps after the support substrate is detached from the substrate.

4. The method of claim 1, wherein the attaching of the support substrate to the top surface of the protection layer comprises:
    sequentially forming a light-to-heat conversion layer and the adhesive member on the protection layer; and attaching the support substrate to the adhesive member.

5. The method of claim 4, wherein the light-to-heat conversion layer or the adhesive member includes an ultraviolet (UV) curable material; and the attaching of the support substrate to the top surface of the protection layer further comprises irradiating a UV ray onto the light-to-heat conversion layer and the adhesive member.

6. The method of claim 1, wherein the adhesive member is formed between the protection layer and the support substrate; and wherein the adhesive member is formed to directly contact at least a portion of the protection layer and at least a portion of the support substrate.

7. A method of fabricating a semiconductor package, the method comprising:

forming a semiconductor device on a first surface of a substrate;

forming bump pads electrically connected to the semiconductor device on the first surface of the substrate;

forming a seed metal layer on the bump pads;

forming bumps on the seed metal layer to overlap with the bump pads;

forming an adhesive member over the first surface of the substrate to cover at least a portion of the seed metal layer;

attaching a support substrate to the substrate so that the adhesive member is disposed between the seed metal layer and the support substrate;

processing a second surface of the substrate opposite to the semiconductor device and the bump pads to remove a portion of the substrate;

detaching the adhesive member and the support substrate from the seed metal layer; and removing portions of the seed metal layer not covered by the bumps.

8. The method of claim 7, wherein the adhesive member is formed to contact an outer periphery region of the seed metal layer before the support substrate is attached to the substrate.

9. The method of claim 7, wherein the detaching of the adhesive member and the support substrate from the seed metal layer comprises coating a debonding solvent on the adhesive member to dissolve the adhesive member and to separate the support substrate from the seed metal layer.

10. The method of claim 7, wherein the detaching of the support substrate from the substrate comprises:

heating the adhesive member to a debonding temperature of the adhesive member to reduce viscosity of the adhesive member; and mechanically peeling the adhesive member and the support substrate from the substrate.

11. A method of manufacturing an electronic device, comprising:

providing a plurality of semiconductor devices on a first surface of a substrate;

providing a plurality of pads on the first surface of the substrate, which pads are electrically coupled to the plurality of semiconductor devices;

providing a protection layer including metal on the first surface of the substrate to continuously cover two or more of the pads;

attaching a support substrate to the top surface of the protection layer by using an adhesive member;

processing a second surface of the substrate opposite the protection layer to remove a portion of the substrate; and detaching the support substrate from the substrate, wherein the protection layer remains to continuously cover the two or more pads when the support substrate is detached from the substrate.

12. The method of claim 11, further comprising forming bumps on the protection layer before the support substrate is attached to the protection layer, wherein the bumps are electrically connected to the plurality of semiconductor devices through the pads.

13. The method of claim 12, further comprising removing portions of the protection layer that are not covered by the bumps after the support substrate is detached from the substrate.

14. The method of claim 11, wherein the attaching of the support substrate to the top surface of the protection layer comprises:

sequentially forming a light-to-heat conversion layer and the adhesive member on the protection layer; and attaching the support substrate to the adhesive member.

15. The method of claim 11, wherein the adhesive member is formed between the protection layer and the support substrate; and the adhesive member is formed to directly contact at least a portion of the protection layer and at least a portion of the support substrate.

16. The method of claim 15, wherein the detaching of the support substrate from the substrate comprises supplying a debonding solvent to a portion of the adhesive member to dissolve the portion of the adhesive member.

17. The method of claim 11, further comprising:

forming a seed metal layer on the first surface of the substrate;

forming bumps on the seed metal layer, the bumps being electrically connected to the plurality of semiconductor devices through the seed metal layer; and removing portions of the seed metal layer which are not covered by the bumps.

18. The method of claim 17, wherein the protection layer is formed on the first surface of the substrate to cover the bumps.

19. The method of claim 11, further comprising:

providing a bus electrically coupled to at least one of the plurality of semiconductor devices; and providing a micro processing unit electrically coupled to the bus.

20. The method of claim 19, further comprising:

providing a display device electrically coupled to the bus.

* * * * *